United States Patent
Chiang

(10) Patent No.: US 6,744,126 B1
(45) Date of Patent: *Jun. 1, 2004

(54) MULTICHIP SEMICONDUCTOR PACKAGE DEVICE

(75) Inventor: Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 7 days.

This patent is subject to a terminal disclaimer.

(21) Appl. No.: 10/137,494

(22) Filed: Apr. 30, 2002

Related U.S. Application Data

(63) Continuation-in-part of application No. 10/042,812, filed on Jan. 9, 2002.

(51) Int. Cl.[7] .............................................. H01L 23/02
(52) U.S. Cl. ....................................... 257/686; 257/777
(58) Field of Search ................................ 257/777, 686, 257/666, 698, 692, 685, 723, 724

(56) References Cited

U.S. PATENT DOCUMENTS

| | | | |
|---|---|---|---|
| 5,081,520 A | 1/1992 | Yoshii et al. ................. 357/80 |
| 5,149,958 A | 9/1992 | Hallenbeck et al. ........ 250/216 |
| 5,241,133 A | 8/1993 | Mullen, III et al. ........ 174/52.4 |
| 5,264,714 A | 11/1993 | Nakaya et al. ................ 257/78 |
| 5,394,303 A | 2/1995 | Yamaji ........................ 361/749 |
| 5,405,809 A | 4/1995 | Nakamura et al. .......... 437/209 |
| 5,665,652 A | 9/1997 | Shimizu ...................... 438/127 |
| 5,674,785 A | 10/1997 | Akram et al. ............... 437/217 |
| 5,744,827 A | 4/1998 | Jeong et al. ................. 257/686 |
| 5,744,859 A | 4/1998 | Ouchida ...................... 257/668 |
| 5,804,771 A | 9/1998 | McMahon et al. .......... 174/255 |
| 5,811,879 A | 9/1998 | Akram ........................ 257/723 |
| 5,834,835 A | 11/1998 | Maekawa .................... 257/680 |
| 5,834,843 A | 11/1998 | Mori et al. .................. 257/723 |
| 5,859,471 A | 1/1999 | Kuraishi et al. ............ 257/666 |
| 5,893,723 A | 4/1999 | Yamanaka ................... 438/65 |
| 5,949,655 A | 9/1999 | Glenn ......................... 361/783 |
| 6,013,877 A | 1/2000 | Degani et al. .............. 174/264 |
| 6,143,588 A | 11/2000 | Glenn ......................... 438/116 |
| 6,159,770 A | 12/2000 | Tetaka et al. ............... 438/112 |
| 6,215,192 B1 * | 4/2001 | Hirata et al. |
| 6,265,770 B1 | 7/2001 | Uchiyama ................... 257/698 |
| 6,274,927 B1 | 8/2001 | Glenn ......................... 257/680 |
| 6,316,838 B1 * | 11/2001 | Ozawa et al. |
| 6,351,027 B1 * | 2/2002 | Giboney et al. |
| 6,424,031 B1 * | 7/2002 | Glenn |
| 6,469,376 B2 * | 10/2002 | Vaiyapuri |
| 6,489,686 B2 * | 12/2002 | Farooq et al. |
| 6,507,098 B1 * | 1/2003 | Lo et al. |
| 6,559,539 B2 * | 5/2003 | Tu et al. |
| 6,566,746 B2 * | 5/2003 | Isank et al. |
| 6,583,503 B2 * | 6/2003 | Akram et al. |

OTHER PUBLICATIONS

Crowley, "Socket Developments for CSP and FBGA Packages," Chip Scale Review, May 1998, pp. 37–40.

(List continued on next page.)

Primary Examiner—Sheila V. Clark
(74) Attorney, Agent, or Firm—David M. Sigmond

(57) ABSTRACT

A multichip semiconductor package device includes first and second devices and a conductive bond. The first device includes an insulative housing, a first semiconductor chip and a conductive trace. The first insulative housing includes a peripheral ledge and a central portion that is recessed relative to the peripheral ledge, and the peripheral ledge and the central portion form a cavity. The conductive trace includes a terminal that extends through the central portion and a lead that protrudes laterally from and extends through the side surface. The second device includes a second semiconductor chip, extends into the cavity and is positioned within and does not extend outside a periphery of the cavity. The conductive bond is inside the cavity, on the terminal and contacts and electrically connects the first and second devices.

40 Claims, 33 Drawing Sheets

OTHER PUBLICATIONS

Forster, "Socket Challenges for Chip–Scale Packages," Chip Scale Review, May 1998, pp. 43–47.

Amagai, "Chip–Scale Packages for Center–Pad Memory Devices," Chip Scale Review, May 1998, pp. 68–77.

Vandevelde et al., "The PSGA, a Lead–Free CSP for High Performance & High Reliable Packaging," Proceedings of the 2001 International Symposium on Microelectronics, Oct. 9, 2001, pp. 260–265.

* cited by examiner

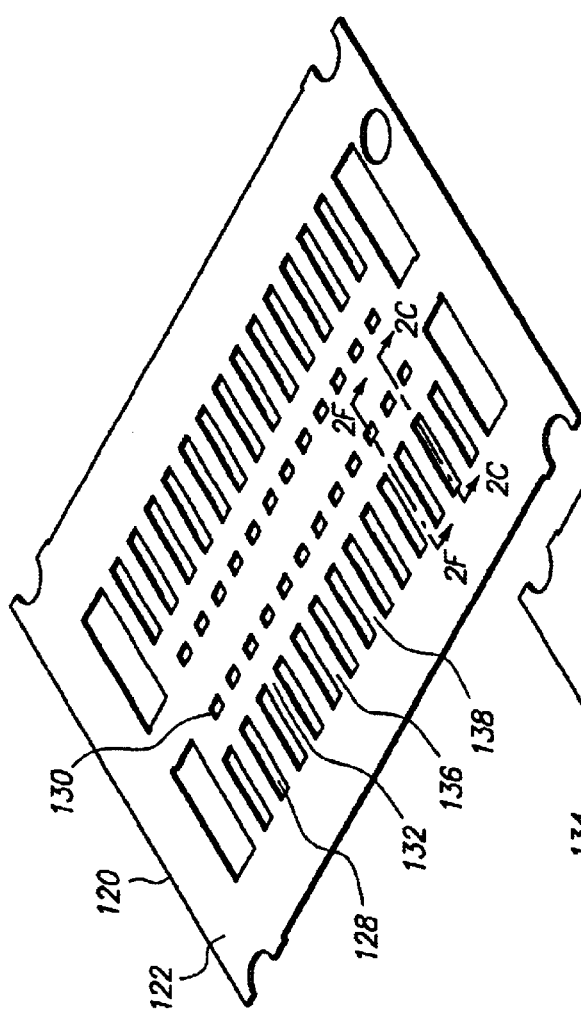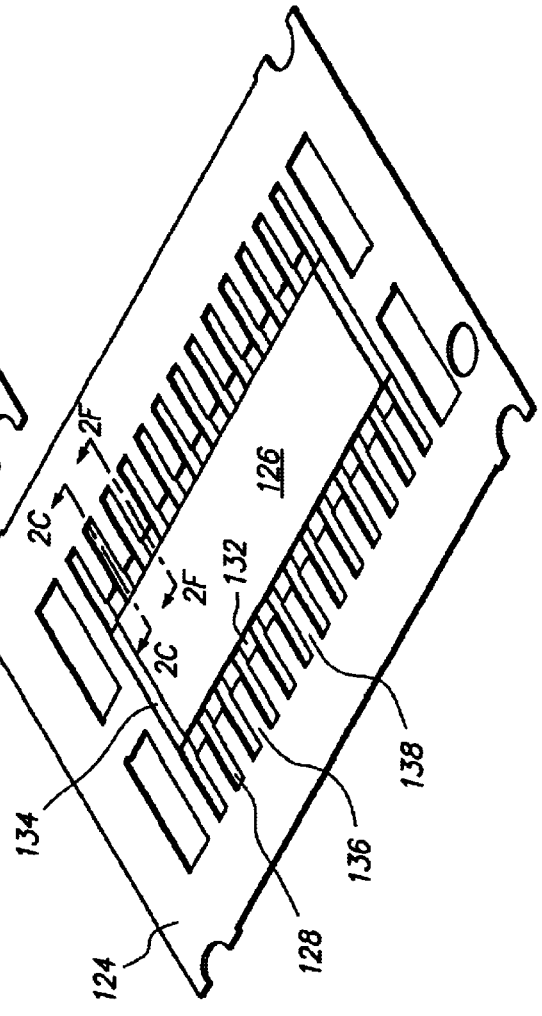

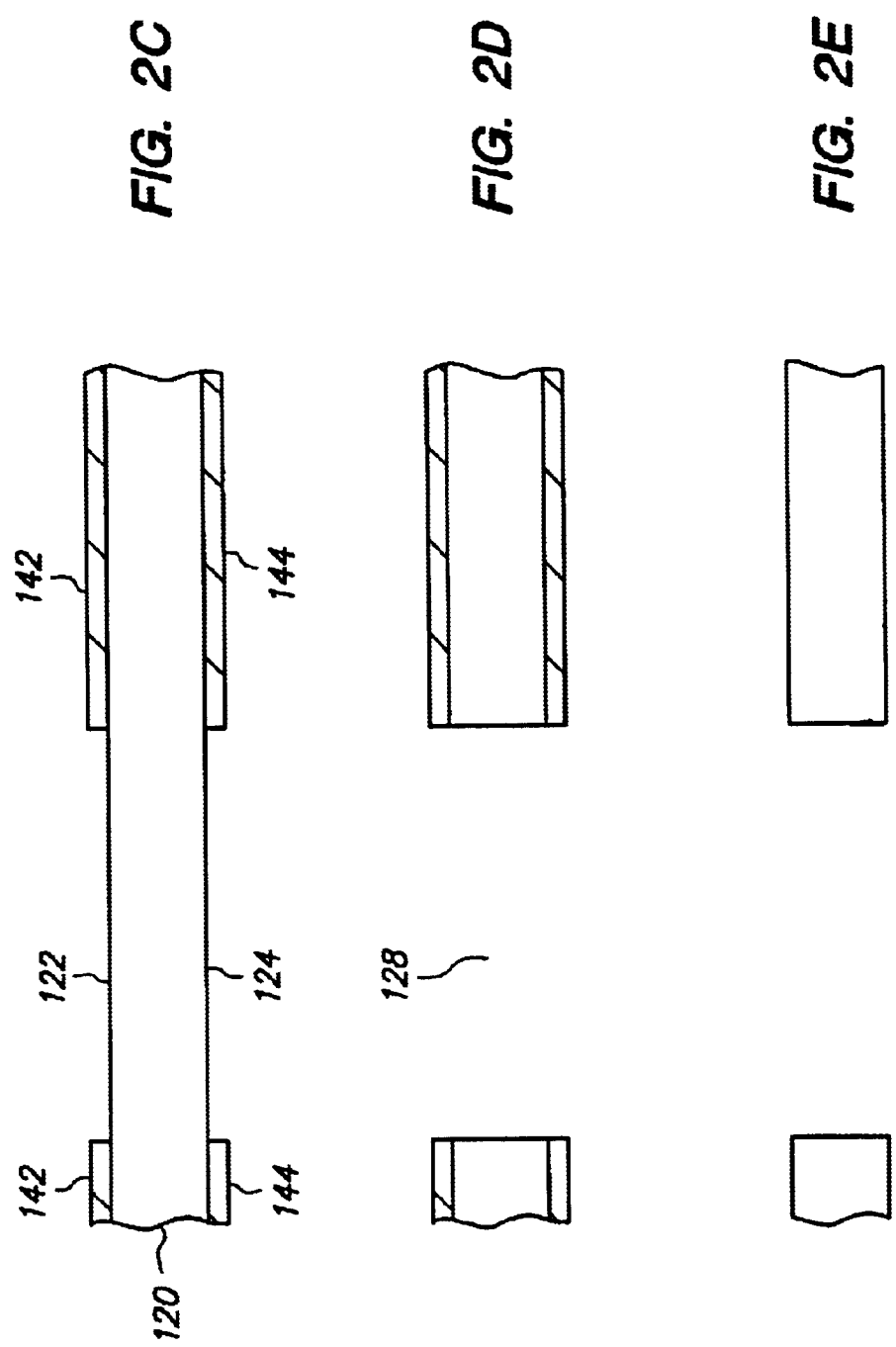

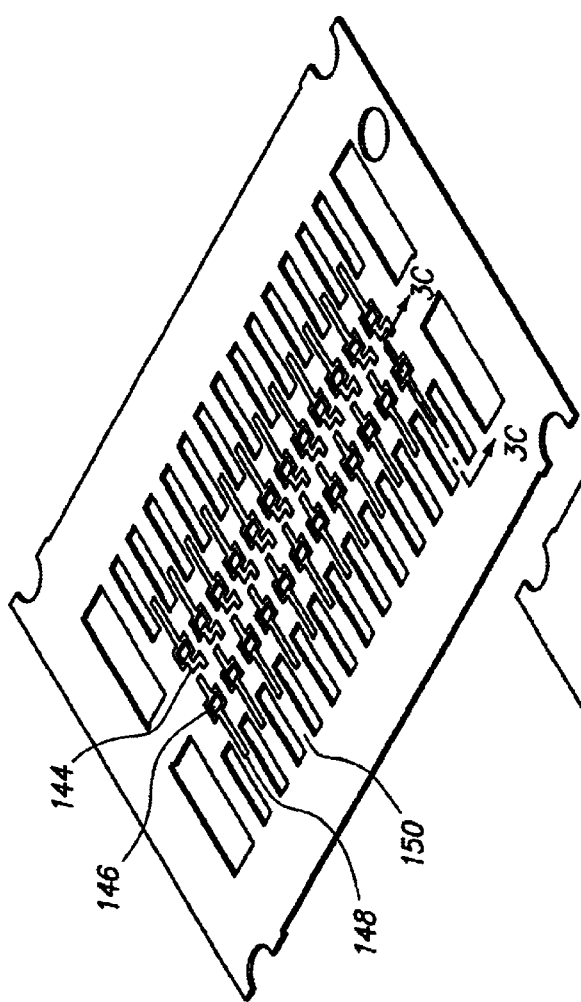
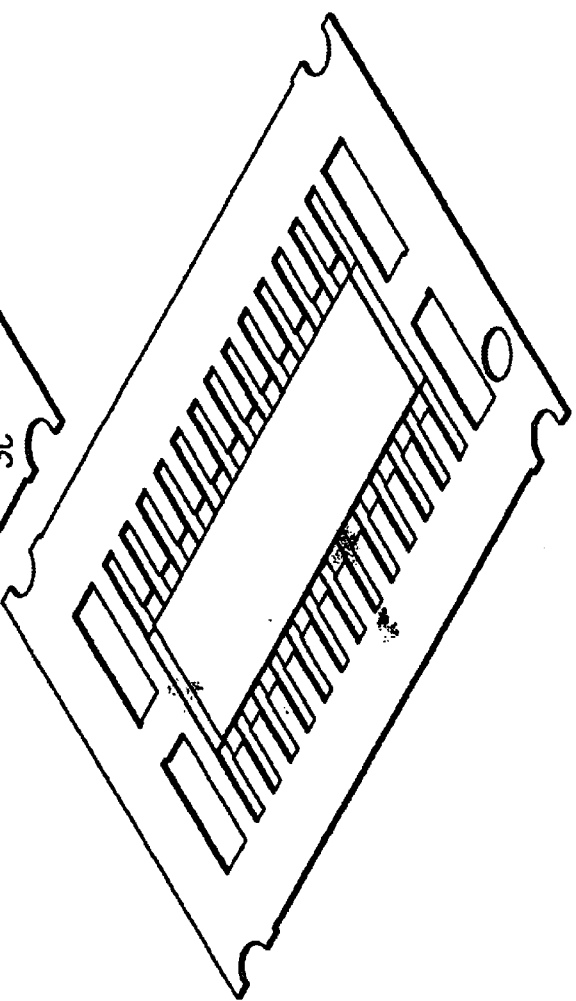
FIG. 3A
FIG. 3B

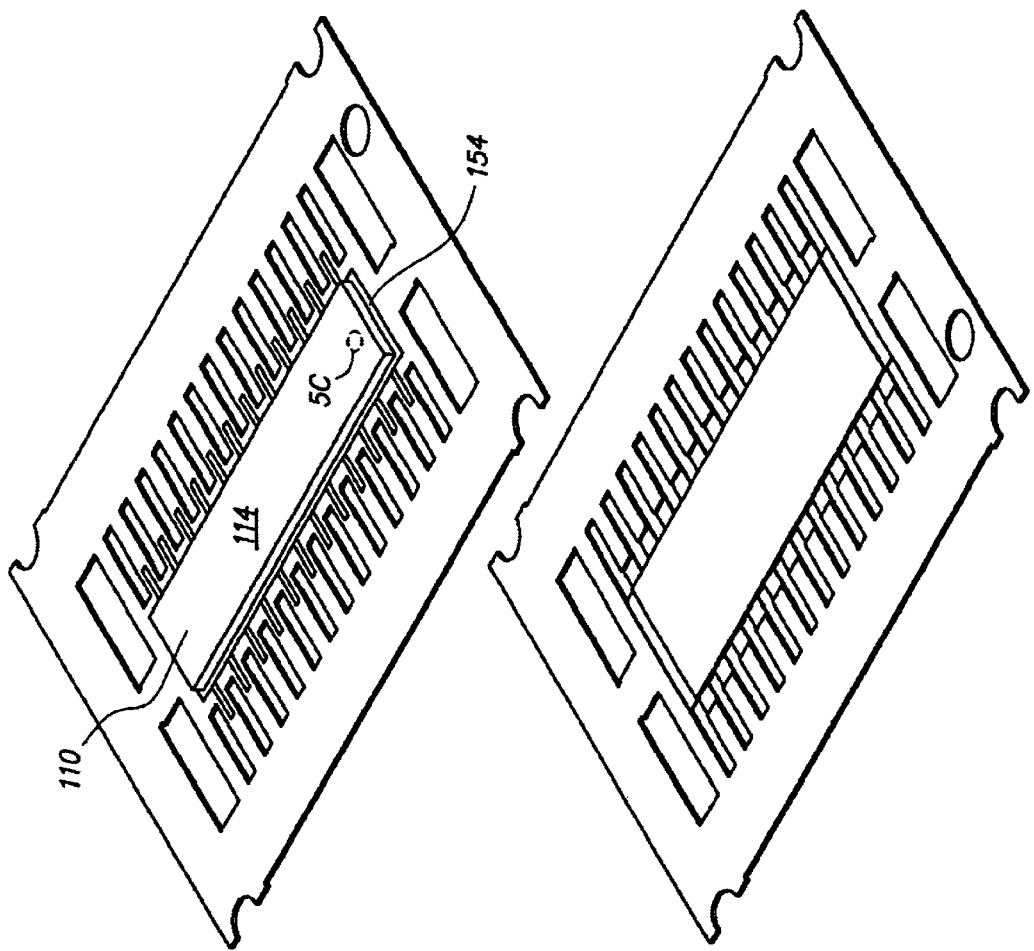

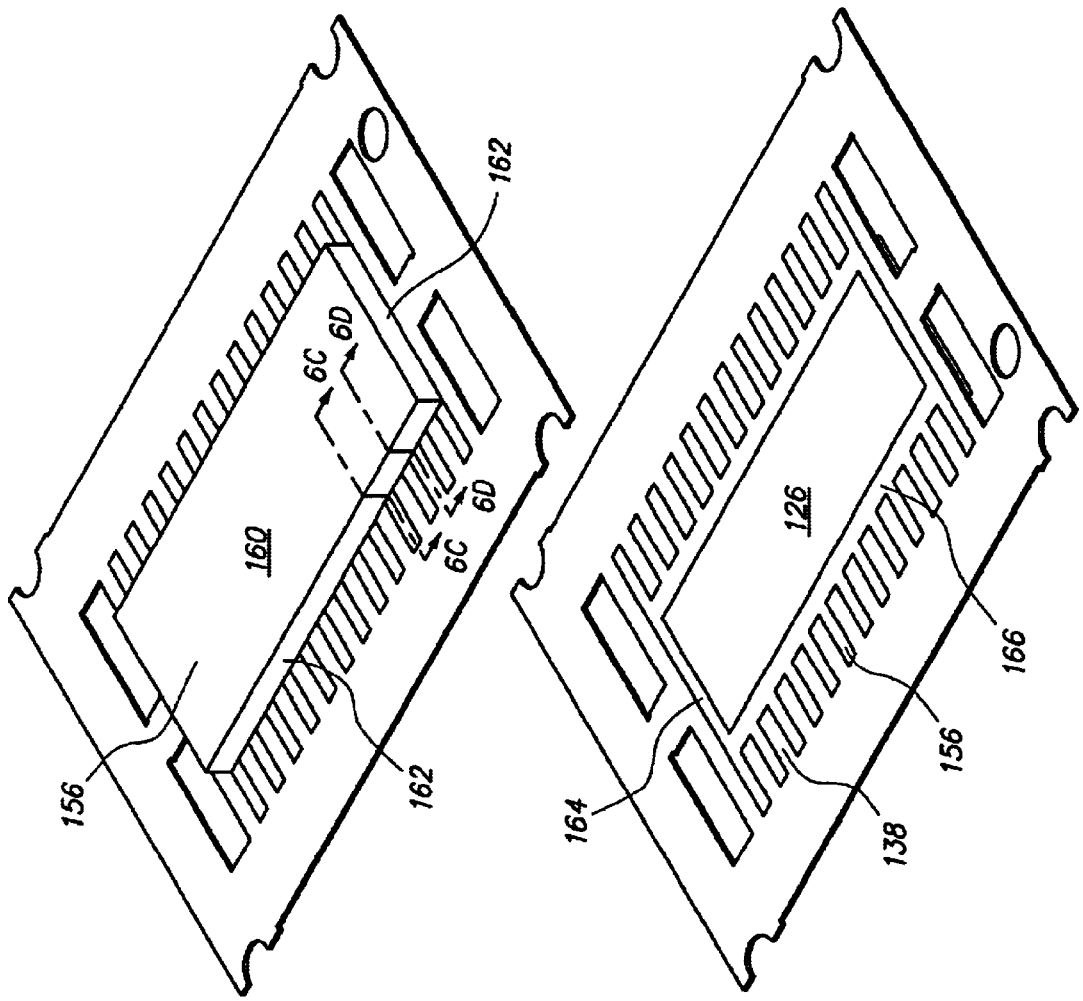

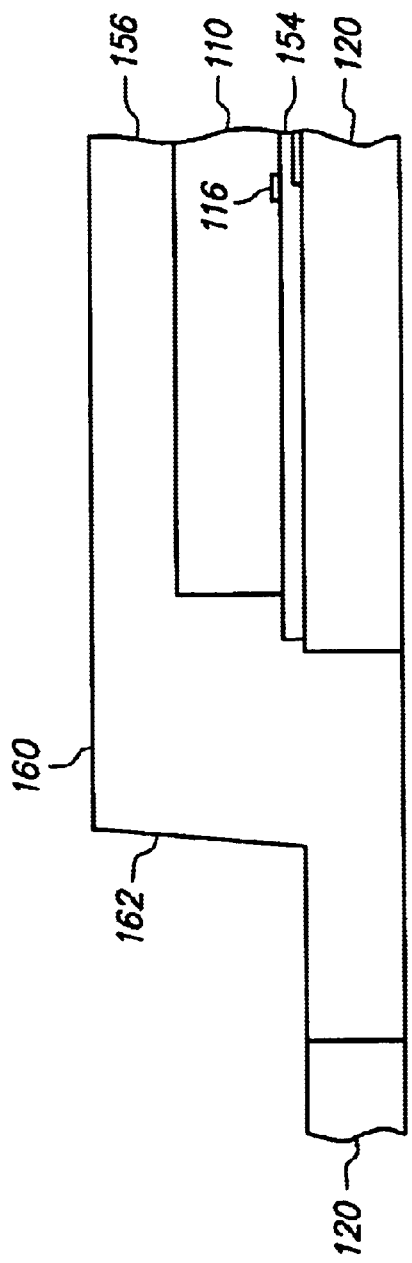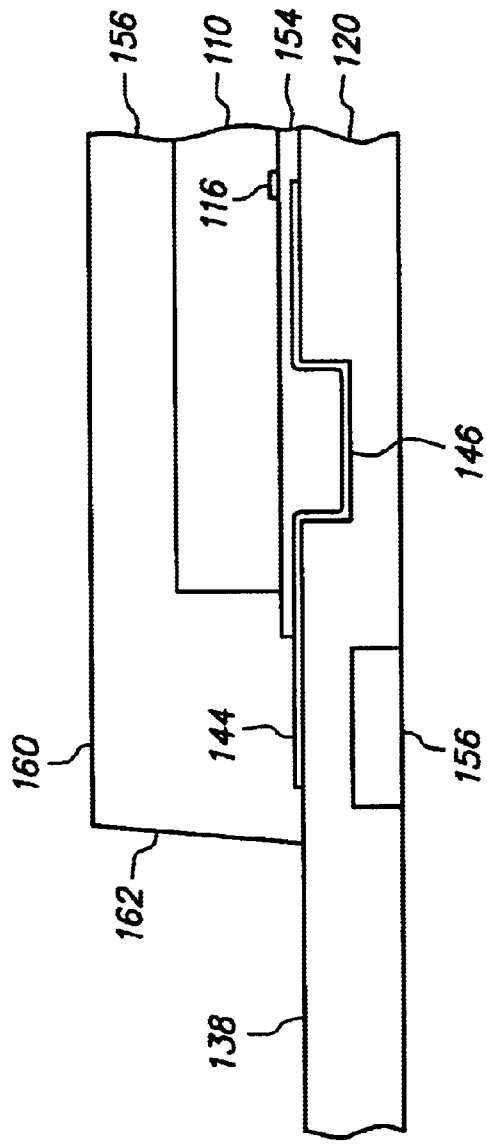

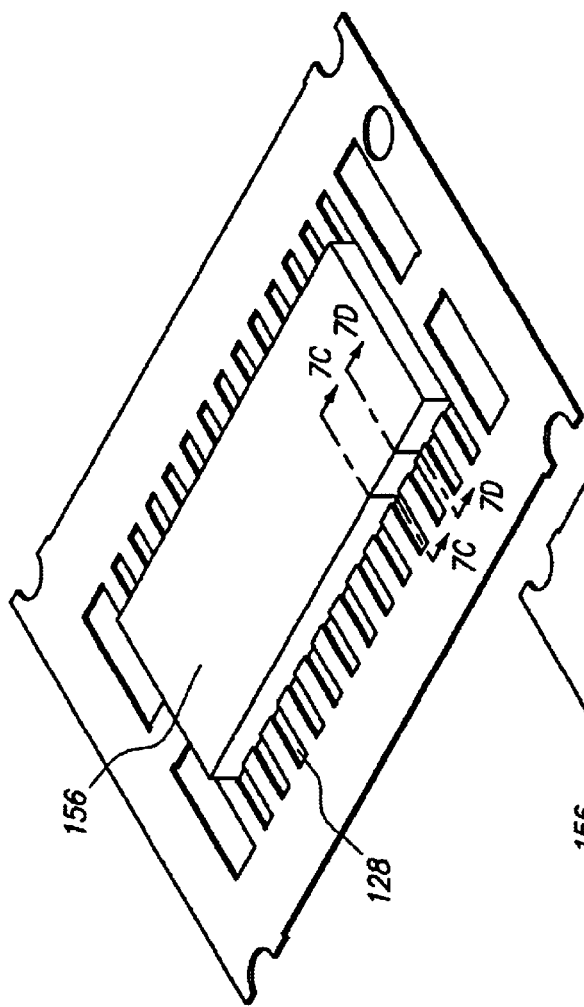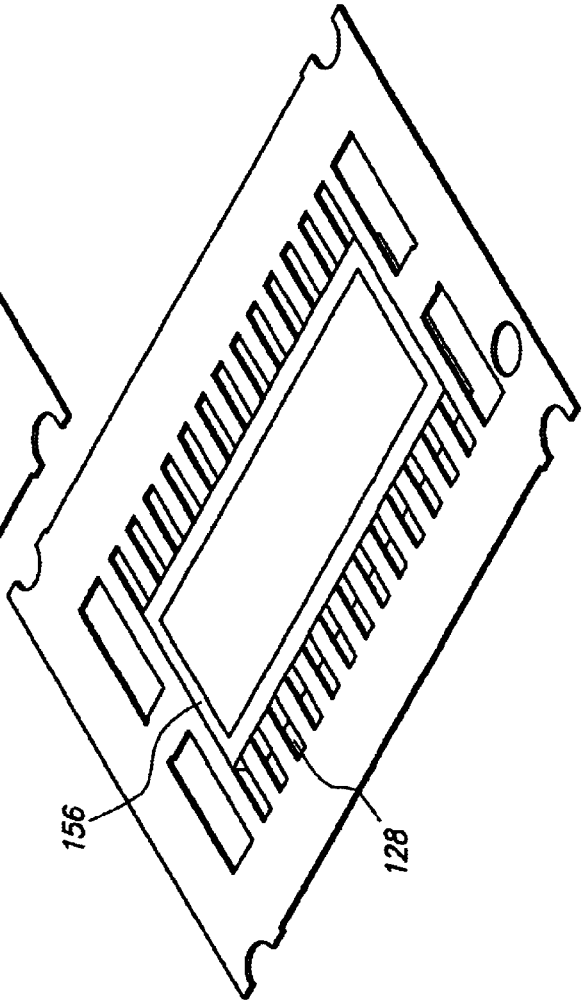

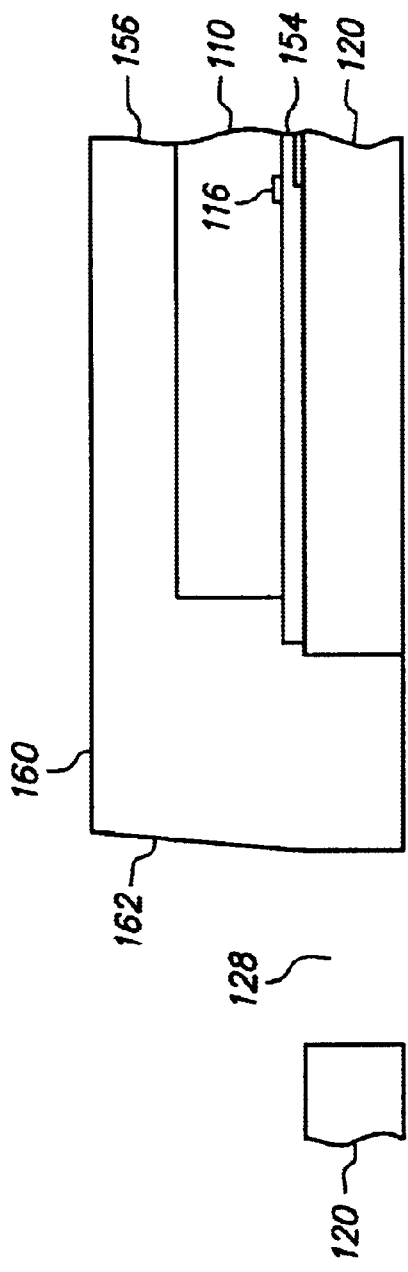
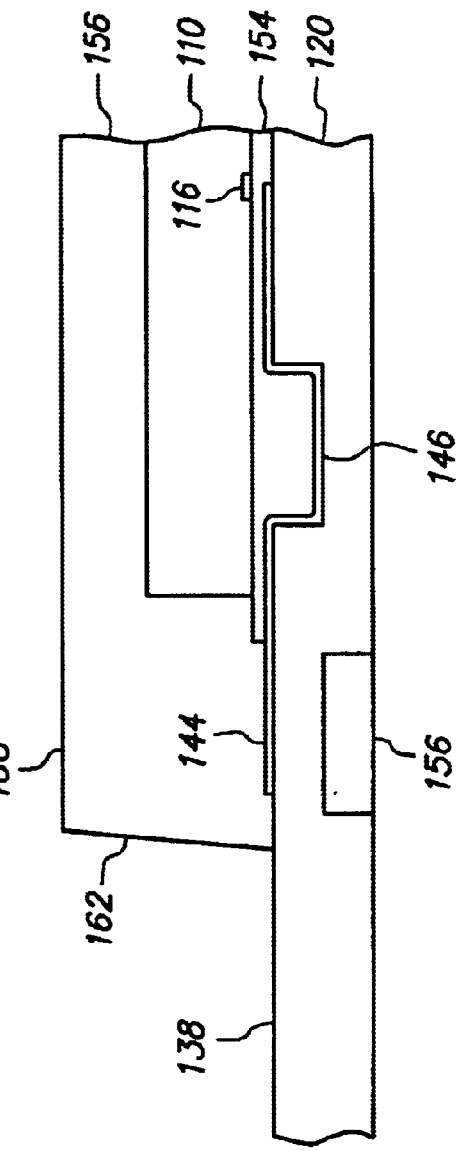

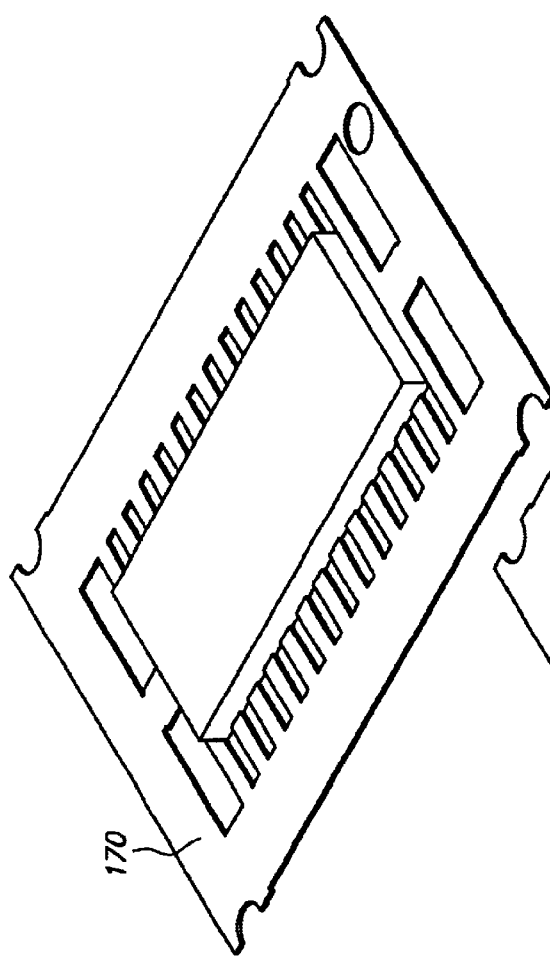
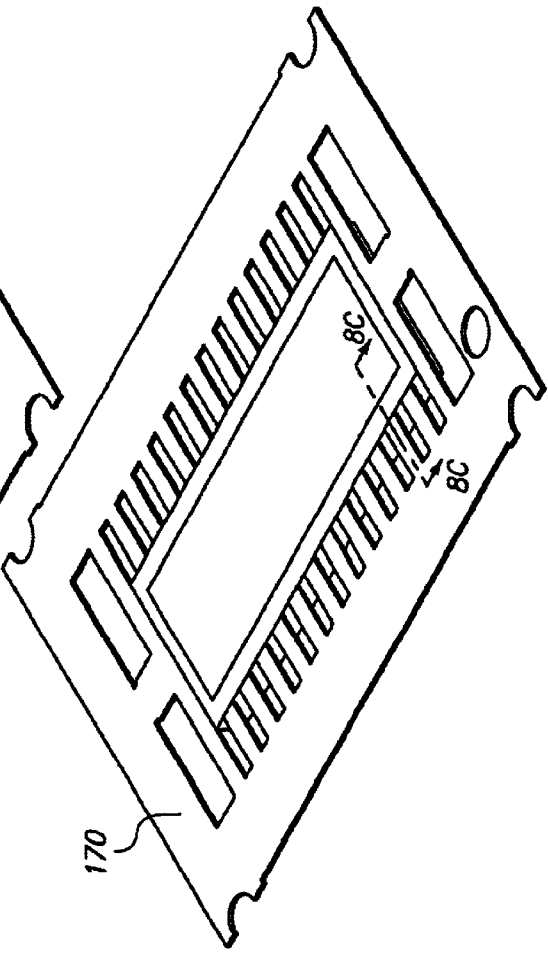
FIG. 8A
FIG. 8B

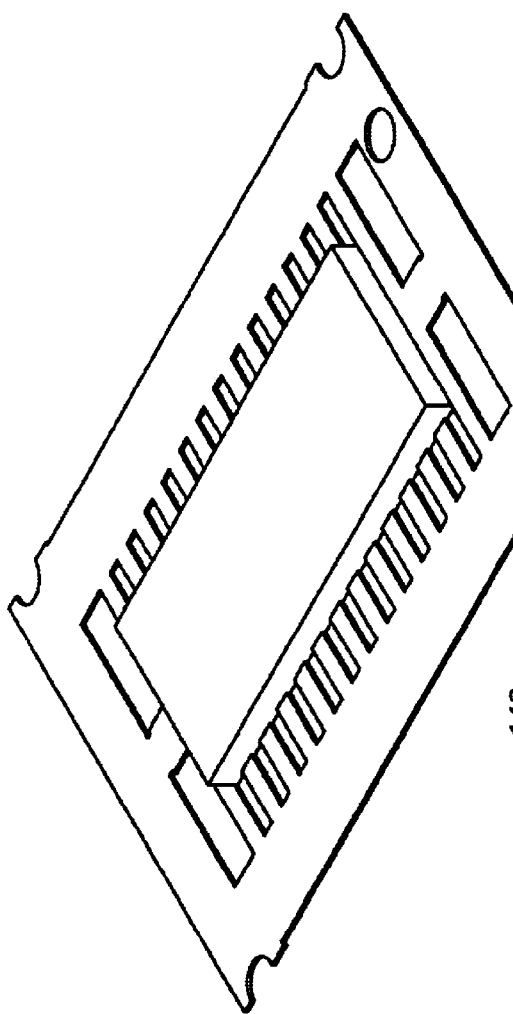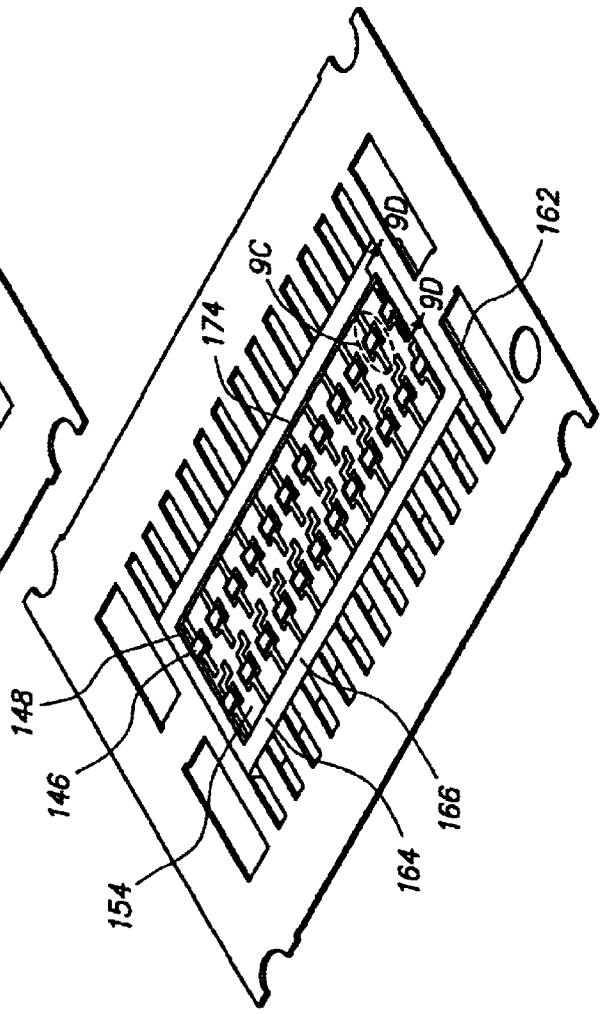

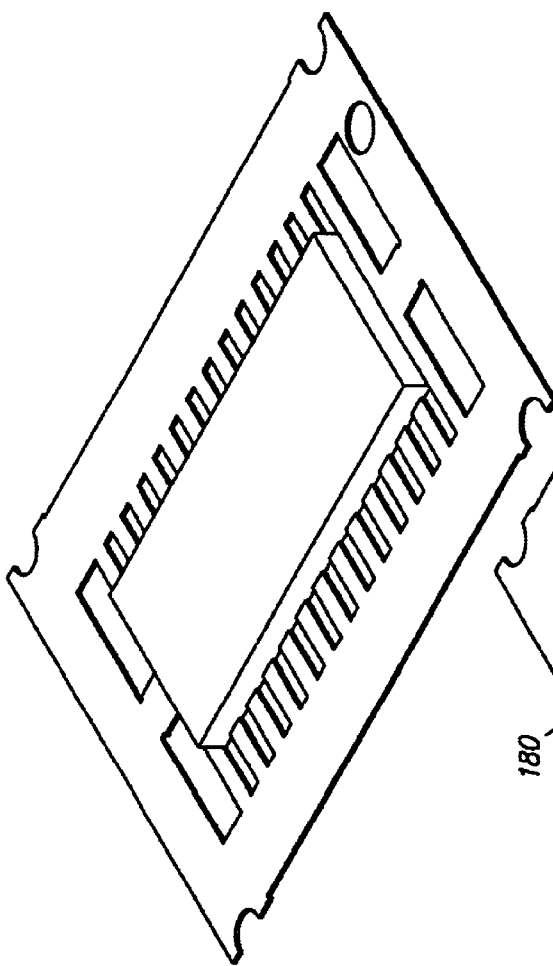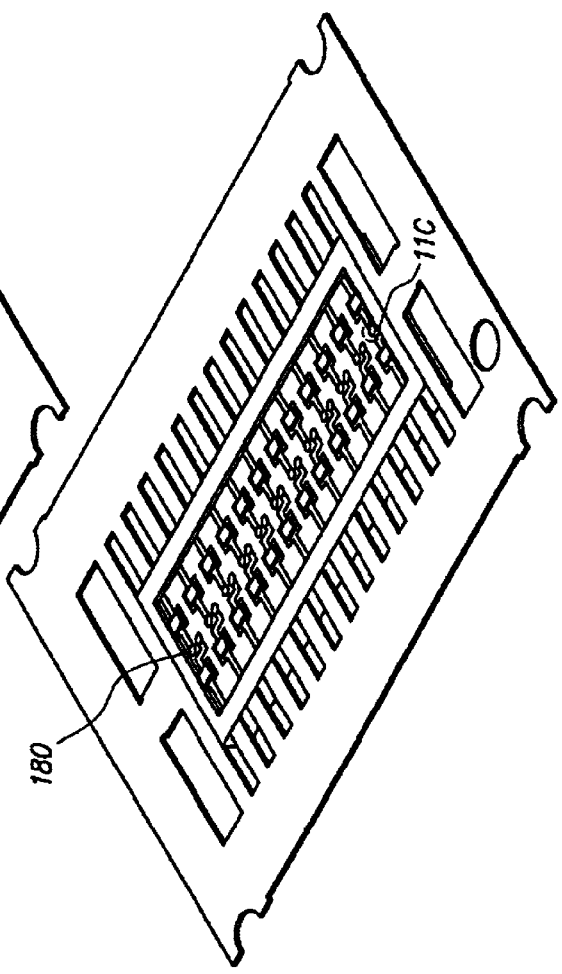

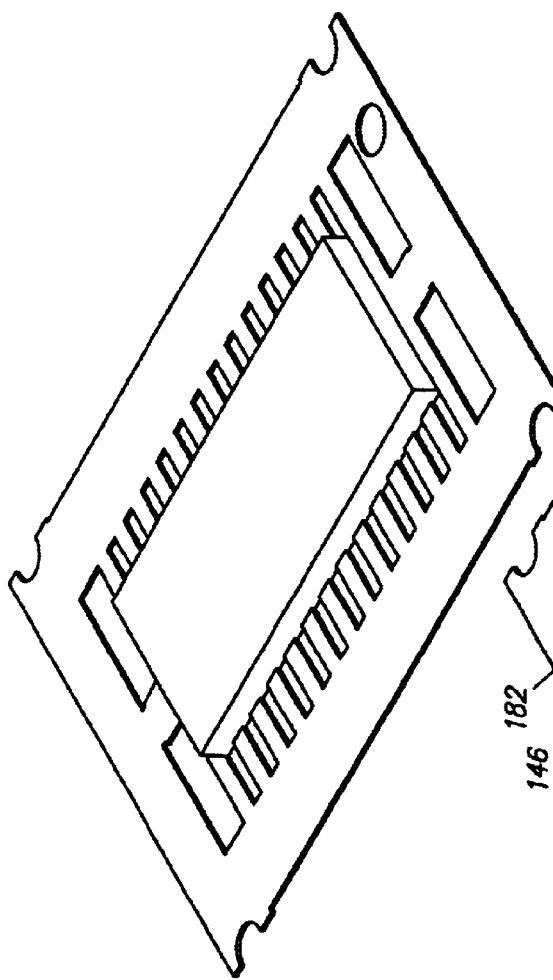
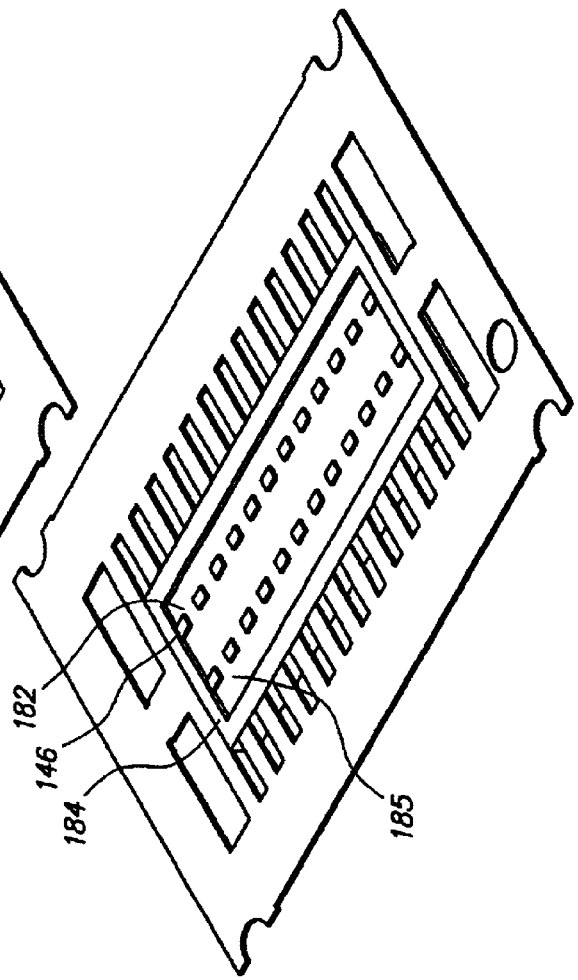

MULTICHIP SEMICONDUCTOR PACKAGE DEVICE

CROSS-REFERENCE TO RELATED APPLICATIONS

This application is a continuation-in-part of U.S. application Ser. No. 10/042,812 filed Jan. 9, 2002, which is incorporated by reference.

BACKGROUND OF THE INVENTION

1. Field of the Invention

The present invention relates to semiconductor packaging, and more particularly to multichip semiconductor package devices.

2. Description of the Related Art

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Semiconductor chips have input/output pads that must be connected to external circuitry in order to function as part of an electronic system. Traditionally, a single chip is individually housed in a single-chip package that is connected to other single-chip packages through a printed circuit board (or motherboard) which supplies power to the chips and provides signal routing among the chips. The single-chip package has connection media that is typically an array of metallic leads (e.g., a lead frame) or a support circuit (e.g., a substrate).

Several connection techniques are widely used for connecting the chip pads and the connection media. These include wire bonding, tape automated bonding (TAB) and flip-chip bonding. Wire bonding is by far the most common. In this approach, wires are bonded, one at a time, from the chip to external circuitry by thermocompression, thermosonic or ultrasonic processes. TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface. Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Many variations exist on these basic methods.

A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. An adhesive is normally underfilled between the chip and the support circuit to reduce stress on the solder joints due to thermal mismatch between the chip and the support circuit, and the underfilling process increases both manufacturing complexity and cost. The solder joints exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies. Thus, none of these conventional connection techniques are entirely satisfactory.

Conventional single-chip packages typically have an area (or footprint) that is many times larger than the area of the chip, causing the printed circuit board to have excessively large area relative to the chips. However, as chip speeds increase, it becomes critical to position the chips close together since excessive signal transmission distance deteriorates signal integrity and propagation times. Other considerations such as manufacturing cost, reliability, heat transfer, moisture resistance, mounting and interconnect standardization, testability, and quality control have also become focal points of chip packaging.

Single-chip packages such as thin small-outline packages (TSOPs), ball grid arrays (BGAs) and chip scale packages (CSPs) have been recently developed to address these considerations. Although these packages provide certain advantages, further size reduction and performance enhancement with these packages has been difficult to obtain due to physical dimension, design and manufacturing constraints.

Multichip modules (MCMs) or hybrid modules that package multiple chips on a common platform are an alternative to single-chip packages. These modules aim to achieve higher packaging density (lower volume and mass per chip), better signal integrity and reasonable manufacturing cost. Conventional multichip modules are essentially two-dimensional structures with multiple chips connected to a planar interconnection substrate which contains traces to supply power and signal transmission. Co-fired ceramic substrates have given way to organic-based substrates due to performance and cost advantages. However, since multichip modules utilize a planar interconnection substrate as the base, their effectiveness in packaging density is limited. For instance, a substrate transmission line that is 25 microns wide, 5 microns high and 10 millimeters long creates high line resistance and signal delays, which necessitates complex wiring rules in order to provide acceptable signal transmission distances and reasonable propagation delays.

Therefore, in order to create higher density packages, reduce area requirements and shorten signal transmission distances, three-dimensional packages with two, three or more vertically stacked chips are an emerging trend. Three-dimensional packages are particularly suitable for the electronic systems such as supercomputers and large cache memory devices which require high operating speed and high capacity in very limited space.

Three-dimensional packages generally follow two approaches. In one approach, individual chips are packaged in conventional single-chip packages and then the single-chip packages are vertically stacked and interconnected to one another. Single-chip packages stacked this way include thin small-outline packages (TSOPs), ball grid arrays (BGAs) and tape chip packages (TCPs), and chip connections within the single-chip packages include wire bonding, TAB and flip-chip bonding. In another approach, leads are connected to the chips, and then the exposed leaded chips are vertically stacked and interconnected to one another. Most three-dimensional packages involve peripheral interconnection, but some provide area array interconnection. Numerous three-dimensional packages are reported in the literature.

U.S. Pat. Nos. 5,484,959, 5,514,907, 5,625,221 and 5,744,827 disclose three-dimensional packages in which stacked single-chip packages have large footprints that require large amounts of space. The single-chip packages also have long extended leads and associated wire bonds that limit electrical performance.

U.S. Pat. Nos. 5,854,507 and 6,072,233 disclose three-dimensional packages with stacked single-chip packages in which solder balls provide the primary vertical interconnects. The solder balls require large amounts of space.

U.S. Pat. No. 5,394,303 discloses a three-dimensional package in which the stacked single-chip packages include a flexible film with wiring layers wrapped around the chip. The flexible film is relatively difficult to wrap and bending the wiring layers causes low yields.

U.S. Pat. Nos. 4,996,583, 5,138,438 and 5,910,685 disclose three-dimensional packages in which TAB leads are connected to and extend beyond the peripheries of the chips, the exposed chips are stacked together and the TAB leads are connected together. The TAB leads for different chips have different shapes and lengths which complicates manufacturing. Furthermore, the TAB leads are interconnected by applying thermocompression, which also complicates manufacturing.

U.S. Pat. Nos. 4,706,166 and 5,104,820 disclose three-dimensional packages in which chips are formed with leads that extend to the sidewalls, the exposed chips are stacked together, and then thin film routing lines are deposited on the sidewalls to interconnect the leads. The wafer process must be modified, and aligning the sidewalls and forming the routing lines on the leads is difficult.

U.S. Pat. Nos. 4,897,708 and 4,954,875 disclose three-dimensional packages composed of wafers rather than individual chips. Cone-shaped vias are formed in the wafers, electrically conductive material is filled in the vias which contacts the pads on the wafers, and the wafers are stacked such that the electrically conductive material in the vias provides vertical interconnects between the pads. The wafer stacks are difficult to separate for repairs and too large for many applications.

Another drawback with many conventional three-dimensional packages is that the vertical interconnects lack the flexibility to accommodate thickness variations of the stacked assemblies. For instance, chip thickness may vary by 20 microns or more even after back-side wafer polishing attempts to planarize the wafer. As a result, vertical interconnects with fixed heights cannot adequately accommodate these thickness variations, and suffer from disoriented, cracked and open connections, high mechanical stress and reliability problems.

In summary, conventional three-dimensional packages suffer from numerous deficiencies including large area requirements, inflexible vertical interconnects, limited electrical performance, poor structural strength and low reliability. Moreover, conventional three-dimensional packages are often manufactured by complicated processes that are impractical for volume production, and too difficult and costly to develop.

In view of the various development stages and limitations in currently available multichip modules and three-dimensional packages, there is a need for a multichip package that is cost-effective, reliable, manufacturable, compact, and provides excellent mechanical and electrical performance.

SUMMARY OF THE INVENTION

An object of the present invention is to provide a multichip semiconductor package device that provides a low cost, high performance, high reliability package. Another object of the present invention is to provide a convenient, cost-effective method of making a multichip semiconductor package device.

Generally speaking, the present invention provides a multichip semiconductor package device that includes first and second devices and a conductive bond. The first device includes an insulative housing, a first semiconductor chip and a conductive trace. The first insulative housing includes a peripheral ledge and a central portion that is recessed relative to the peripheral ledge, and the peripheral ledge and the central portion form a cavity. The conductive trace includes a terminal that extends through the central portion and a lead that protrudes laterally from and extends through the side surface. The second device includes a second semiconductor chip, extends into the cavity and is positioned within and does not extend outside a periphery of the cavity. The conductive bond is inside the cavity, on the terminal and contacts and electrically connects the first and second devices.

In accordance with one aspect of the invention, a multichip semiconductor package device includes (1) a first device that includes (a) an insulative housing with a top surface, a bottom surface, and a peripheral side surface between the top and bottom surfaces, wherein the bottom surface includes a peripheral ledge and a central portion that is recessed relative to the peripheral ledge, and the peripheral ledge and the central portion form a cavity, (b) a first semiconductor chip within the insulative housing and outside the cavity, wherein the first chip includes an upper surface and a lower surface, and the upper surface includes a conductive pad, and (c) a conductive trace that includes a terminal and a lead, wherein the terminal extends through the central portion, the lead protrudes laterally from and extends through the side surface, the terminal and the lead are spaced and separated from one another outside the insulative housing, and the terminal and the lead are electrically connected to one another and to the pad, (2) a second device that includes a second semiconductor chip, wherein the second device extends into the cavity and is positioned within and does not extend outside a periphery of the cavity, and (3) a conductive bond inside the cavity and on the terminal that contacts and electrically connects the first and second devices.

Preferably, the insulative housing includes a first single-piece housing portion that contacts the first chip and the lead and is spaced from the terminal, and a second single-piece housing portion that contacts the first housing portion and the terminal, such that the first housing portion provides the top surface, the side surface and the peripheral ledge, and the second housing portion provides the central portion.

It is also preferred that the terminal and the conductive bond are within a periphery of the first chip and a periphery of the second chip, the first chip is within and does not extend outside the periphery of the cavity, and the second device includes a major surface within the cavity.

It is also preferred that the first device is a single-chip TSOP package, and the second device is a single chip or a chip scale package.

It is also preferred that the multichip device is devoid of wire bonds and TAB leads.

An advantage of the multichip device of the present invention is that it is reliable, cost-effective, easily manufacturable, compact, and can be directly mounted on a printed circuit board. Another advantage is that the multichip device can have short signal paths between the chips. Another advantage is that the multichip device can accommodate chips with varying sizes and thickness while maintaining reliable vertical electrical interconnects between the chips. Another advantage is that the multichip device need not include wire bonds or TAB leads. Another advantage is that the multichip device can be manufactured using low temperature processes which reduces stress and improves reliability. A further advantage is that the multichip device can be manufactured using well-controlled processes which can be easily implemented by circuit board, lead frame and tape manufacturers. Still another advantage is that the multichip device can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–18A are top perspective views that show a method of making a multichip semiconductor package device in accordance with an embodiment of the present invention;

FIGS. 1B–18B are bottom perspective views corresponding to FIGS. 1A–18A, respectively;

FIGS. 2C, 2D and 2E are enlarged cross-sectional views taken across line 2C—2C in FIGS. 2A and 2B that show the formation of a representative slot in greater detail;

FIG. 6C is an enlarged cross-sectional view taken across line 6C—6C in FIG. 6A that shows the encapsulant filling a representative slot in greater detail;

FIG. 6D is an enlarged cross-sectional view taken across line 6D—6D in FIG. 6A that shows the encapsulant filling a representative recessed portion in greater detail;

FIG. 7C is an enlarged cross-sectional view taken across line 7C—7C in FIG. 7A that shows the encapsulant removed from a portion of a representative slot in greater detail;

FIG. 7D is an enlarged cross-sectional view taken across line 7D—7D in FIG. 7A that shows the encapsulant intact in a representative recessed portion in greater detail;

DETAILED DESCRIPTION OF THE PREFERRED EMBODIMENTS

FIGS. 1A–18A and 1B–18B are top and bottom perspective views, respectively, of a method of making a multichip semiconductor package device in accordance with an embodiment of the present invention.

Figure 1A:
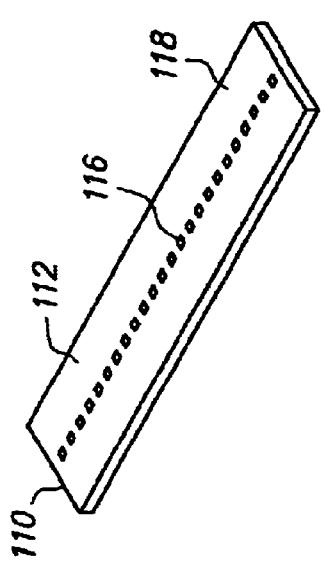
Figure 1B:
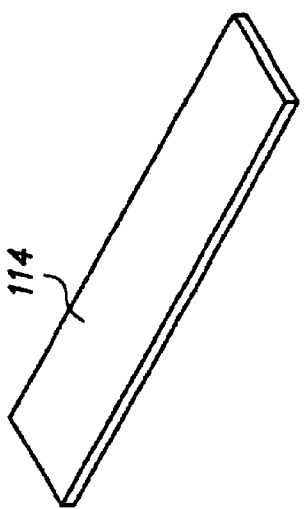

FIGS. 1A and 1B are top and bottom perspective views, respectively, of semiconductor chip 110 which is an integrated circuit in which various transistors, circuits, interconnect lines and the like are formed (not shown). Chip 110 includes opposing major surfaces 112 and 114 and has a thickness of 200 microns between these surfaces. Surface 112 is an upper surface, and surface 114 is a lower surface. Surface 112 is the active surface and includes conductive pads 116 arranged in a single row and passivation layer 118. Pads 116 are substantially aligned with passivation layer 118 so that surface 112 is essentially flat. Alternatively, if desired, pads 116 can extend above or be recessed below passivation layer 118. Pads 116 provide bonding sites to electrically couple chip 110 with external circuitry. Thus, a particular pad 116 can be input/output pad or a power/ground pad. Pads 116 have a length and width of 70 microns.

Pads 116 have aluminum bases that are cleaned by dipping chip 110 in a solution containing 0.05 M phosphoric acid at room temperature for 1 minute and then rinsed in distilled water. Thereafter, pads 116 are treated to provide surface layers that will accommodate subsequently formed connection joints. Pads 116 can be treated by depositing several metal layers, such as chromium/copper/gold or titanium/nickel/gold on the aluminum bases. The chromium or titanium layer provides a barrier for the aluminum base and an adhesive between the overlaying metal and the aluminum base. The metal layers, however, are typically selectively deposited by evaporation or electroplating using a mask which is a relatively complicated process. Alternatively, pads 116 can be treated by forming nickel surface layers on the aluminum bases. For instance, chip 110 is dipped in a zinc solution to deposit a zinc layer on the aluminum bases. This step is commonly known as zincation. Preferably, the zinc solution contains about 150 grams/liter of NaOH, 25 grams/liter of ZnO, and 1 gram/liter of NaNO$_3$, as well as tartaric acid to reduce the rate at which the aluminum bases dissolve. Thereafter, nickel surface layers are electrolessly deposited on the zincated aluminum bases. A suitable electroless nickel plating solution is Enthone Enplate NI-424 at 85° C.

FIGS. 2A and 2B are top and bottom perspective views, respectively, of metal base 120. Metal base 120 is a copper lead frame that includes opposing major surfaces 122 and 124, central portion 126, slots 128, recessed portions 130, 132 and 134, non-recessed portions 136 and leads 138. Slots 128 are formed in two parallel rows and extend between surfaces 122 and 124. Recessed portions 130 are formed in surface 122, extend into metal base 120 towards surface 124, and are spaced from slots 128. Recessed portions 132 are formed in surface 124, extend into metal base 120 towards surface 122, and are between and adjacent to slots 128 in the same row. Recessed portions 134 are formed in surface 124, extend into metal base 120 towards surface 122, and are between and adjacent to slots 128 in separate rows. Non-recessed portions 136 are between and adjacent to slots 128 in the same row, and are adjacent to recessed portions 132. Leads 138 include recessed portions 132 and non-recessed portions 136.

Thus, recessed portions 130 are recessed relative to non-recessed portions 136 at surface 122 and coplanar with non-recessed portions 136 at surface 124, and recessed portions 132 and 134 are coplanar with non-recessed portions 136 at surface 122 and recessed relative to non-recessed portions 136 at surface 124. Recessed portions 130 and leads 138 are arranged in two parallel rows and each recessed portion 130 is aligned with a corresponding lead 138. Leads 138 include opposing parallel outer edges defined by adjacent slots 128, and the outer edges extend across recessed portions 132 and non-recessed portions 136. The combination of slots 128, recessed portions 132 and recessed portions 134 provide a continuous rectangular channel that is adjacent to and extends 360 degrees around central portion 126, and slots 128 provide comb-like canals that extend outwardly from the channel. Metal base 120 includes other openings and notches that are used for tooling engagement and alignment purposes.

Metal base 120 has a thickness of 200 microns, slots 128 have a length of 1500 microns, a width of 300 microns and a center-to-center spacing of 800 microns, recessed portions 130 have a length and width of 500 microns and a depth of 120 microns, recessed portions 132 have a length and width of 500 microns and a depth of 120 microns, recessed portions 134 have a width of 500 microns and a depth of 120 microns, and leads 138 have a length of 1500 microns (500 microns at recessed portions 132 and 1000 microns at non-recessed portions 136), a width of 500 microns and a center-to-center spacing of 800 microns.

Figure 2F:
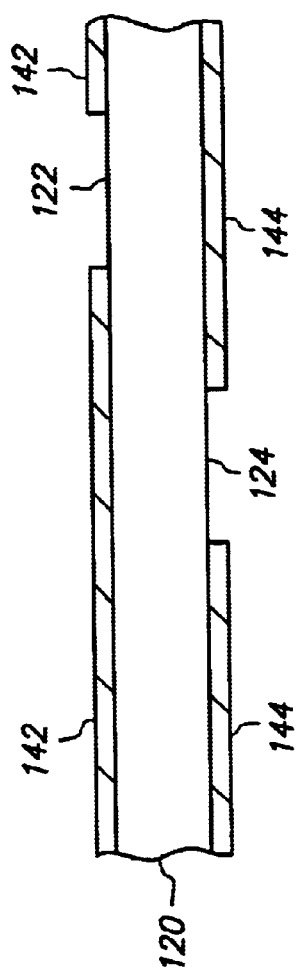
FIGS. 2F, 2G and 2H are enlarged cross-sectional views taken across line 2F—2F in FIGS. 2A and 2B that show the formation of representative recessed portions in greater detail.
Figure 2G:
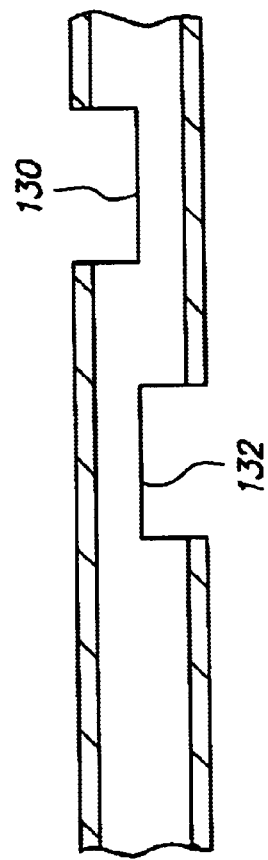
Figure 2H:
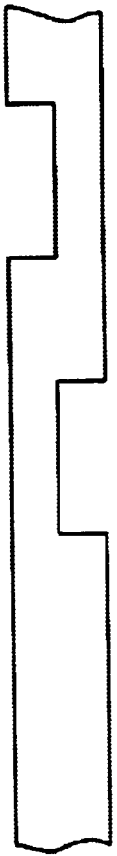

FIGS. 2C, 2D and 2E are enlarged cross-sectional views taken across line 2C—2C in FIGS. 2A and 2B that show the formation of a representative slot 128 in greater detail, and FIGS. 2F, 2G and 2H are enlarged cross-sectional views taken across line 2F—2F in FIGS. 2A and 2B that show the formation of representative recessed portions 130 and 132 in greater detail.

FIGS. 2C and 2F are enlarged cross-sectional views of photoresist layers 142 and 144 formed on surfaces 122 and 124, respectively. Photoresist layers 142 and 144 are simultaneously deposited as continuous dry films and then patterned by selectively applying light through respective reticles (not shown), applying a developer solution to remove the photoresist portions rendered soluble by the light, and then hard baking, as is conventional. As a result, photoresist layer 142 contains openings that selectively expose portions of surface 122, and photoresist layer 144 contains openings that selectively expose portions of surface 124. Photoresist layers 142 and 144 have a thickness of 15 microns.

FIGS. 2D and 2G are enlarged cross-sectional views of various features formed in metal base 120 by wet chemical etching using photoresist layers 142 and 144 as etch masks. In particular, the structure is dipped in a wet chemical etch that provides a front-side etch through the openings in photoresist layer 142 to the exposed portions of surface 122 and a back-side etch through the openings in photoresist layer 144 to the exposed portions of surface 124. The structure is submerged in the wet chemical etch long enough for the etchant to etch about 120 microns into metal base 120. That is, the wet chemical etch provides a "half-etch" that removes slightly over one-half ($^{120}/_{200}$) the thickness of metal base 120 at the exposed portions. Thus, the front-side etch partially forms slot 128 and completely forms recessed portion 130, the back-side etch partially forms slot 128 and completely forms recessed portion 132, and the combination of the front-side and back-side etches completely forms slot 128. Likewise, the front-side and back-side etches are applied simultaneously, and slot 128, recessed portion 130 and recessed portion 132 are formed simultaneously. The wet chemical etch also forms the other slots 128, recessed portions 130 and recessed portions 132 as well as recessed portions 134 and the unlabeled openings and notches in a similar manner.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing metal base 120 to the wet chemical etch to provide the desired etch depth can be established through trial and error.

FIGS. 2E and 2H are enlarged cross-sectional views of metal base 120 after photoresist layers 142 and 144 are simultaneously stripped.

FIGS. 3A and 3B are top and bottom perspective views, respectively, of metal traces 144 formed on metal base 120. Metal traces 144 include terminals 146 and routing lines 148. Terminals 146 are formed in recessed portions 130, extend into metal base 120 and protrude below routing lines 148. Terminals 146 are bumped and include cavities that extend into and face away from recessed portions 130. Routing lines 148 are formed outside recessed portions 130 and extend from terminals 146 to leads 138. More particularly, routing lines 148 extend to recessed portions 132 where they are centered between the adjoining slots 128 but do not extend to non-recessed portions 136. Routing lines 148 also extend from terminals 146 towards the inside of central portion 126 in the opposite direction. Thus, each metal trace 144 includes a terminal 146 in a corresponding recessed portion 130 and a routing line 148 that (1) extends from the terminal 146 to a corresponding lead 138, and (2) extends from the terminal 146 in the opposite direction towards the inside of central portion 126. Accordingly, leads 138 and metal traces 144 are formed in one-to-one relation. Conductive traces 150 include leads 138 and metal traces 144.

Metal traces 144 are electroplated onto metal base 120. Metal traces 144 are composed of a first nickel layer electroplated onto metal base 120, a copper layer electroplated onto the first nickel layer, and a second nickel layer electroplated onto the copper layer. Thus, the first nickel layer is sandwiched between and contacts metal base 120 and the copper layer, the copper layer is sandwiched between and contacts the first and second nickel layers, and the second nickel layer contacts the copper layer and is exposed. The first and second nickel layers and the copper layer are shown as a single layer for convenience of illustration.

Metal traces 144 have a thickness of 10 microns provided by the first nickel layer with a thickness of 1 micron, the copper layer with a thickness of 8 microns, and the second nickel layer with a thickness of 1 micron. Terminals 146 have a length and width of 500 microns and a height of 120 microns, and routing lines 148 have a width (orthogonal to the elongated length) of 55 microns.

Terminals 146 include tapered sidewalls that slant inwardly as the vertical distance from routing lines 148 increases. This follows the shape of recessed portions 130, which have tapered sidewalls due to the isotropic nature of the wet chemical etch. For convenience of illustration, the sidewalls are shown generally orthogonal to surface 122.

Figure 3C:
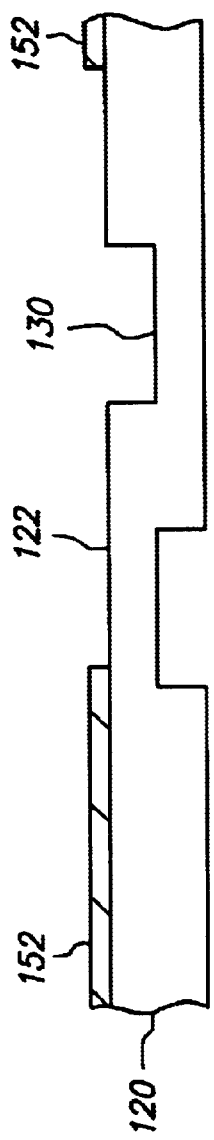
FIGS. 3C, 3D and 3E are enlarged cross-sectional views taken across line 3C—3C in FIG. 3A that show the formation of a representative metal trace in greater detail.
Figure 3D:
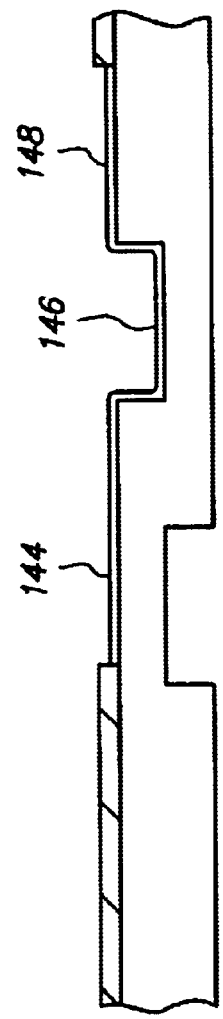
Figure 3E:
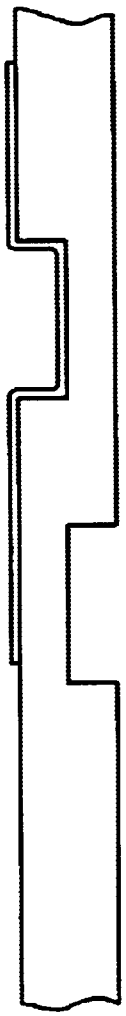

FIGS. 3C, 3D and 3E are enlarged cross-sectional views taken across line 3C—3C in FIG. 3A that show the formation of a representative metal trace 144 in greater detail.

FIG. 3C is an enlarged cross-sectional view of photoresist layer 152 formed on surface 122. Photoresist layer 152 is deposited as a continuous dry film and then patterned by selectively applying light through a reticle (not shown), applying a developer solution to remove the photoresist portions rendered soluble by the light, and then hard baking, as is conventional. As a result, photoresist layer 152 contains an opening that selectively exposes a portion of surface 122 that includes recessed portion 130. Photoresist layer 152 has a thickness of 15 microns.

FIG. 3D is an enlarged cross-sectional view of metal trace 144 formed on metal base 120. Metal trace 144 is formed in the opening in photoresist layer 152 and on the exposed portion of surface 122 by an electroplating operation using photoresist layer 152 as a plating mask. Thus, metal trace 144 is formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the first nickel layer electroplates (deposits or grows) on the exposed portion of surface 122. The nickel electroplating operation continues until the first nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. The copper electroplating operation continues until the copper layer has the desired thickness. Thereafter, the structure is removed from the electrolytic copper plating solution and submerged in an electrolytic nickel plating solution such as Technic Techni Nickel "S" at room temperature while current is applied to the plating bus to electroplate the second nickel layer on the copper layer. The nickel electroplating operation continues until the second nickel layer has the desired thickness. Thereafter, the structure is removed from the electrolytic nickel plating solution and rinsed in distilled water to remove contaminants.

FIG. 3E is an enlarged cross-sectional view of metal base 120 and metal trace 144 after photoresist layer 152 is stripped.

Figures 4A, 4B:
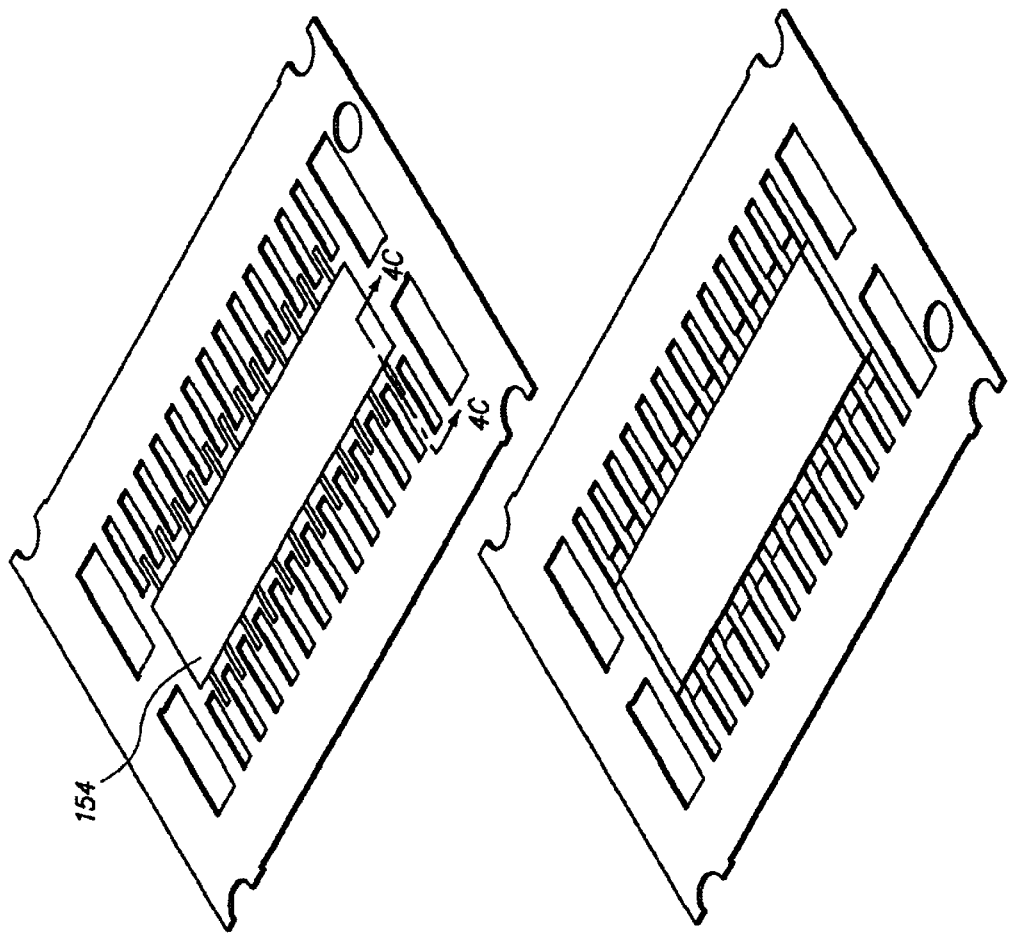

FIGS. 4A and 4B are top and bottom perspective views, respectively, of adhesive 154 formed on metal base 120 and metal traces 144. Adhesive 154 may include an organic surface protectant such as HK 2000 which is promptly applied to metal base 120 and metal traces 144 after photoresist layer 152 is stripped to reduce native oxide formation on the exposed surfaces. The use of organic surface protectant layers in insulative adhesives for semiconductor package devices is well-known in the art. Thereafter, a liquid resin (A stage) epoxy is applied over a predetermined portion of central portion 126 using stencil printing. During stencil printing, a stencil (not shown) is placed over metal base 120, a stencil opening is aligned with the predetermined portion, and then a squeegee (not shown) pushes the liquid resin along the surface of the stencil opposite metal base 120, through the stencil opening and onto the predetermined portion. The liquid resin is compliant enough at room temperature to conform to virtually any shape. The predetermined portion of central portion 126 is slightly offset from the periphery of central portion 126. Therefore, the liquid resin fills terminals 146 but does not reach surface 124 or slots 128. The liquid resin has a thickness of 30 microns over surface 122.

Figure 4C:
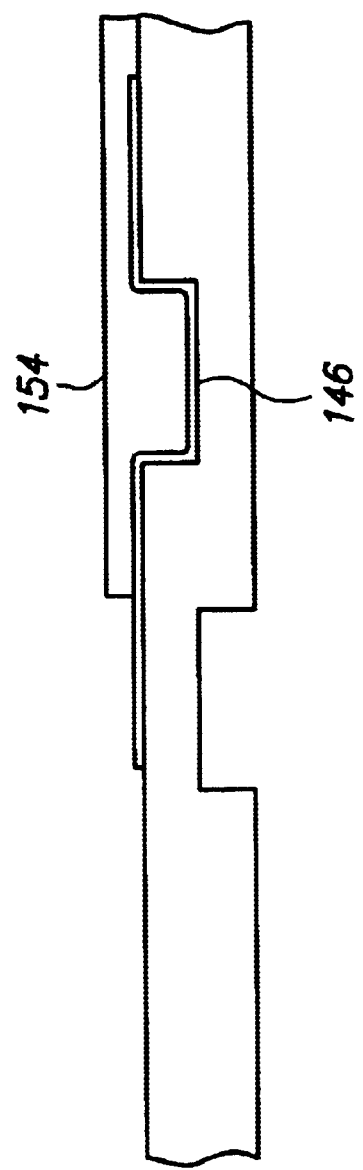
FIG. 4C is an enlarged cross-sectional view taken across line 4C—4C in FIG. 4A that shows the liquid resin filling a representative terminal in greater detail.

FIG. 4C is an enlarged cross-sectional view taken across line 4C—4C in FIG. 4A that shows the liquid resin filling a representative terminal 146 in greater detail.

FIGS. 5A and 5B are top and bottom perspective views, respectively, of chip 110 mechanically attached to metal base 120 by adhesive 154. Adhesive 154 is disposed between and contacts surface 112 of chip 110 and metal base 120, and is disposed between and contacts surface 112 of chip 110 and metal traces 144. Thus, surface 112 of chip 110 faces towards metal base 120 and metal traces 144 and is covered, and surface 114 of chip 110 faces away from metal base 120 and metal traces 144 and is exposed. Chip 110 and metal base 120 do not contact one another, and chip 110 and metal traces 144 do not contact one another.

Chip 110 and metal base 120 are positioned relative to one another so that chip 110 is disposed within the periphery of adhesive 154, terminals 146 are disposed within the periphery of chip 110 between pads 116 and the outer edges of chip 110, routing lines 148 extend within and outside the periphery of chip 110 and overlap and are electrically isolated from pads 116, and slots 128, recessed portions 132 and 134, non-recessed portions 136 and leads 138 are disposed outside the periphery of chip 110. Routing lines 148 overlap pads 116 in one-to-one relation. Thus, each pad 116 has an associated conductive trace 150 which includes a single lead 138, terminal 146 and routing line 148.

Chip 110 and metal base 120 can be aligned using an automated pattern recognition system. Adhesive 154 is sandwiched between chip 110 and metal base 120 using relatively low pressure. Thereafter, adhesive 154 is heated and fully cured (C stage) at relatively low temperature in the range of 200 to 250° C. to form a solid adhesive electrically insulative thermosetting epoxy die attach that mechanically fastens chip 110 to metal base 120 and metal traces 144. Adhesive 154 is 10 microns thick between pads 116 and routing lines 148.

At this stage, metal base 120 provides a carrier for chip 110.

Figure 5C:
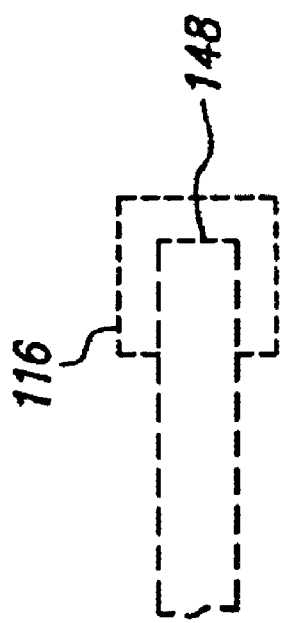
FIG. 5C is an enlarged plan view of encircled detail 5C in FIG. 5A that shows a representative pad and routing line in greater detail.

FIG. 5C is an enlarged plan view of encircled detail 5C in FIG. 5A that shows a representative pad 116 and routing line 148 in greater detail. Since pad 116 and routing line 148 are not visible from surface 114 of chip 110, they are shown in phantom. Routing line 148 includes a distal end that overlaps pad 116.

FIGS. 6A and 6B are top and bottom perspective views, respectively, of encapsulant 156 formed on chip 110 and metal base 120 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

Initially the structure is accurately positioned within a mold (not shown). The mold contacts surfaces 122 and 124 slightly outside recessed portions 132 and 134, but does not contact or extend into recessed portions 132 and 134. The mold defines a box-shaped mold cavity that extends above surface 122, surrounds chip 110 and adhesive 154, overlaps recessed portions 132 and 134, and slightly overlaps non-recessed portions 136. Thus, portions of slots 128 adjacent to recessed portions 132 extend into the mold cavity, while other portions of slots 128 adjacent to non-recessed portions 136 do not. Next, encapsulant 156 is introduced into the mold cavity as a liquid resin under pressure and then hardened to form a solid single-piece molded plastic base during the transfer molding operation. Encapsulant 156 fills the mold cavity and contacts all exposed surfaces within the mold cavity. As a result, encapsulant 156 forms a box-shaped portion, shaped like the mold cavity, that contacts and extends above surface 114 and the outer edges of chip 110, surface 122, routing lines 148 and adhesive 154. Furthermore, encapsulant 156 fills slots 128 and recessed portions 132 and 134. That is, since slots 128 and recessed portions 132 and 134 form a continuous rectangular channel with outwardly extending comb-like canals, and encapsulant 156 enters slots 128 and recessed portions 132 and 134 under pressure, encapsulant 156 fills and assumes the shape of the channel and canals. However, surface 124 outside recessed portions 132 and 134 remains exposed, and encapsulant 156 does not contact (or contacts substantially none of) surface 124 outside recessed portions 132 and 134. Likewise, encapsulant 156 does not contact pads 116 or terminals 146.

Encapsulant 156 forms a first single-piece housing portion that includes top surface 160, four peripheral side surfaces 162 and bottom surface 164. Encapsulant 156 also includes peripheral portion 166 at bottom surface 164. Peripheral portion 166 has a rectangular shape (in the channel) with outwardly extending comb-like fingers (in the canals). Top surface 160 occupies the entire surface area between side surfaces 162, however bottom surface 164 does not. Peripheral portion 166 occupies a peripheral portion of the surface area between side surfaces 162 that is outside the periphery of chip 110 without occupying an inner central portion of the surface area between side surfaces 162. Central portion 126 is surrounded by, adjacent to and coplanar with peripheral portion 166, occupies the inner central portion and remains exposed. Thus, bottom surface 164 of encapsulant 156 at peripheral portion 166 is coplanar with surface 124 of metal base 120 at central portion 126. In addition, encapsulant 156 completely surrounds leads 138. In particular, encapsulant 156 contacts the tops of recessed portions 132 at surface 122, the outer edges of recessed portions 132 at slots 128, and the bottoms of recessed portions 132 at surface 124, thereby forming lateral openings with sidewalls that contact and span 360 degrees around leads 138. As a result, encapsulant 156 interlocks leads 138, thereby enhancing the mechanical attachment between chip 110 and leads 138.

Encapsulant 156 is a solid adherent compressible protective layer that provides back-side environmental protection such as moisture resistance and particle protection for chip 110 as well as mechanical support for leads 138.

FIG. 6C is an enlarged cross-sectional view taken across line 6C—6C in FIG. 6A that shows encapsulant 156 filling a representative slot 128 in greater detail, and FIG. 6D is an enlarged cross-sectional view taken across line 6D—6D in FIG. 6A that shows encapsulant 156 filling a representative recessed portion 132 in greater detail.

FIGS. 7A and 7B are top and bottom perspective views, respectively, of encapsulant 156 removed from portions of slots 128 that laterally extend outwardly at side surfaces 162. In other words, the comb-like fingers of encapsulant 156 are selectively removed while the remainder of encapsulant 156 remains intact. This can be accomplished using a mechanical cutting operation. For instance, a mold die (not shown) with an excise blade and a base can be used. The excise blade contains two rows of comb-like blade portions that are aligned with and disposed above slots 128, and the base contains two rows of openings that are aligned with and disposed below slots 128 as the structure is spaced from the excise blade and rests on the base. The excise blade is then actuated toward the base such that each blade portion enters a corresponding slot 128 and cuts off the finger of encapsulant 156 within that slot.

At this stage, leads 138 are arranged in opposing rows that protrude laterally from and extend through two opposing side surfaces 162 of encapsulant 156.

FIG. 7C is an enlarged cross-sectional view taken across line 7C—7C in FIG. 7A that shows encapsulant 156 removed from a portion of a representative slot 128 in greater detail, and FIG. 7D is an enlarged cross-sectional view taken across line 77D in FIG. 7A that shows encapsulant 156 intact in a representative recessed portion 132 in greater detail.

FIGS. 8A and 8B are top and bottom perspective views, respectively, of protective coating 170 formed on metal base 120 outside the periphery of encapsulant 156. Thus, protective coating 170 covers the exposed surfaces of metal base 120 outside central portion 126. More particularly, protective coating 170 covers the portions of leads 138 that protrude from encapsulant 156 as well as the remaining portions of metal base 120 outside leads 138. Protective coating 170 is electroplated onto metal base 120 and is composed of tin with a thickness of 20 microns. For convenience of illustration, protective coating 170 is considered a surface layer that is part of metal base 120 and leads 138.

Figure 8C:
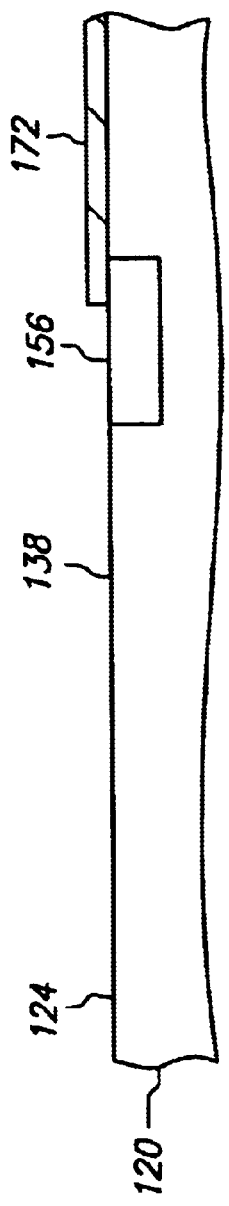
FIGS. 8C, 8D and 8E are enlarged cross-sectional views taken across line 8C—8C in FIG. 8B that show the formation of a protective coating in greater detail.
Figure 8D:
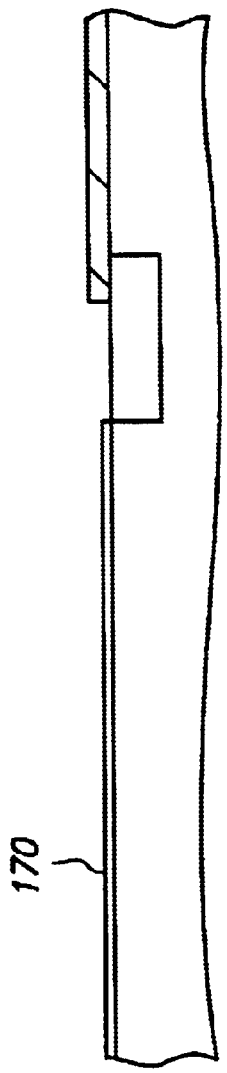
Figure 8E:

FIGS. 8C, 8D and 8E are enlarged cross-sectional views taken across line 8C—8C in FIG. 8B that show the formation of protective coating 170 in greater detail.

FIG. 8C is an enlarged cross-sectional view of ink layer 172 formed on surface 124. Ink layer 172 is deposited as a liquid resin (A stage) epoxy over central portion 126 using stencil printing. Thereafter, the liquid resin is cured or hardened at relatively low temperature of about 120° C. to form a solid layer. As a result, ink layer 172 covers central portion 126 at surface 124, overlaps encapsulant 156 at surface 164 and selectively exposes the remainder of metal base 120 outside encapsulant 156. Ink layer 172 has a thickness of 30 microns.

FIG. 8D is an enlarged cross-sectional view of protective coating 170 formed on metal base 120. Protective coating 170 is formed on the exposed portions of metal base 120 by an electroplating operation using ink layer 172 as a plating mask. Initially, a plating bus (not shown) is connected to metal base 120, current is applied to the plating bus from an external power source, and metal base 120 is submerged in an electrolytic tin plating solution such as Technic Techni NF MTB at room temperature. As a result, the tin electroplates on the exposed surfaces of metal base 120. The tin electroplating operation continues until the tin layer has the desired thickness. Thereafter, the structure is removed from the electrolytic tin plating solution and rinsed in distilled water to remove contaminants.

FIG. 8E is an enlarged cross-sectional view of metal base 120 and protective layer 170 after ink layer 172 is stripped using an alkaline solution that is highly selective of the epoxy ink with respect to tin, copper and the molding compound.

FIGS. 9A and 9B are top and bottom perspective views, respectively, of the structure after central portion 126 of metal base 120 is removed. The structure is dipped in a wet chemical etch that is highly selective of copper with respect to tin, nickel, epoxy and the molding compound. Therefore, the wet chemical etch removes central portion 126 but has no appreciable effect on leads 138, metal traces 144, adhesive 154, encapsulant 156 and protective coating 170. As a result, terminals 146, routing lines 148 and adhesive 154 become exposed. Peripheral portion 166 is shaped as a rectangular peripheral ledge with four inner side surfaces 174 previously adjacent to and covered by central portion 126 that become exposed. Inner side surfaces 174 are located within and face away from outer side surfaces 162, are orthogonal to bottom surface 164, and extend between adhesive 154 and bottom surface 164.

A suitable wet chemical etch can be provided by the same solution used to form slots 128 and recessed portions 130, 132 and 134. The optimal etch time for exposing the structure to the wet chemical etch without excessively exposing the portions of leads 138 embedded in peripheral portion 166 and adjacent to inner side surfaces 174 after the selected copper has been removed can be established through trial and error.

The wet chemical etch initially removes the first 80 microns of central portion 126 and reaches terminals 146. However, the first nickel layers of terminals 146, which were electroplated on metal base 120, become the exposed surface layers for terminals 146 and provide etch masks that protect the underlying copper layers (between the first and second nickel layers). Thereafter, the wet chemical etch removes the remaining 120 microns of central portion 126 and reaches routing lines 148 and adhesive 154. However, the first nickel layers of routing lines 148, which were electroplated on metal base 120, become the exposed surface layers for routing lines 148. Furthermore, routing lines 148 are embedded in and coplanar with adhesive 154 at the exposed surface that was adjacent to central portion 126. Therefore, the exposed nickel surfaces of routing lines 148 and adhesive 154 provide etch masks that protect the underlying copper layers (between the first and second nickel layers) of routing lines 148.

Advantageously, encapsulant 156 interlocks and provides mechanical support for leads 138, and therefore reduces the mechanical strain on adhesive 154. The enhanced mechanical strength is particularly useful after central portion 126 has been removed.

At this stage, chip 110 remains embedded in adhesive 154 and encapsulant 156, and routing lines 148 overlap and remain electrically isolated from pads 116.

Figure 9C:
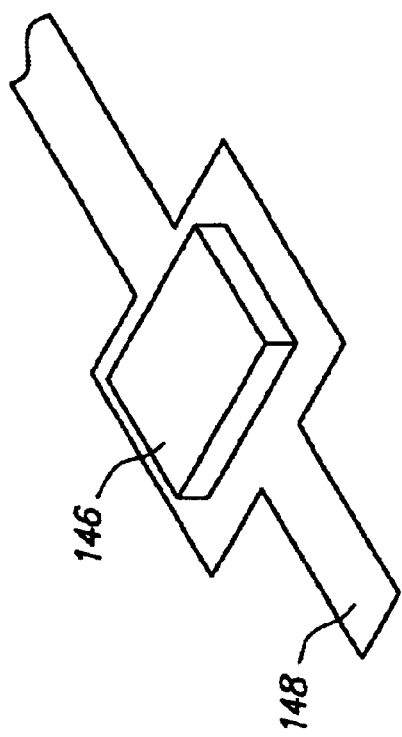
FIG. 9C is an enlarged perspective view of encircled detail 9C in FIG. 9B that shows a representative terminal in greater detail.
Figure 9D:
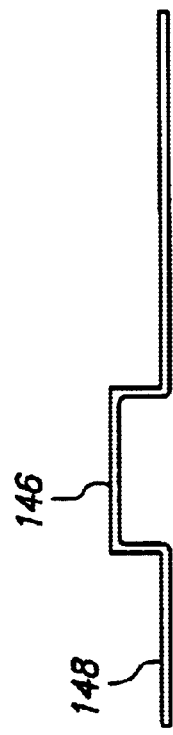
FIG. 9D is an enlarged cross-sectional view taken across line 9D—9D in FIG. 9B that shows a representative terminal in greater detail.

FIG. 9C is an enlarged perspective view of encircled detail 9C in FIG. 9B that shows a representative terminal 146 in greater detail, and FIG. 9D is an enlarged cross-sectional view taken across line 9D—9D in FIG. 9B that shows a representative terminal 146 in greater detail.

Figure 10A:
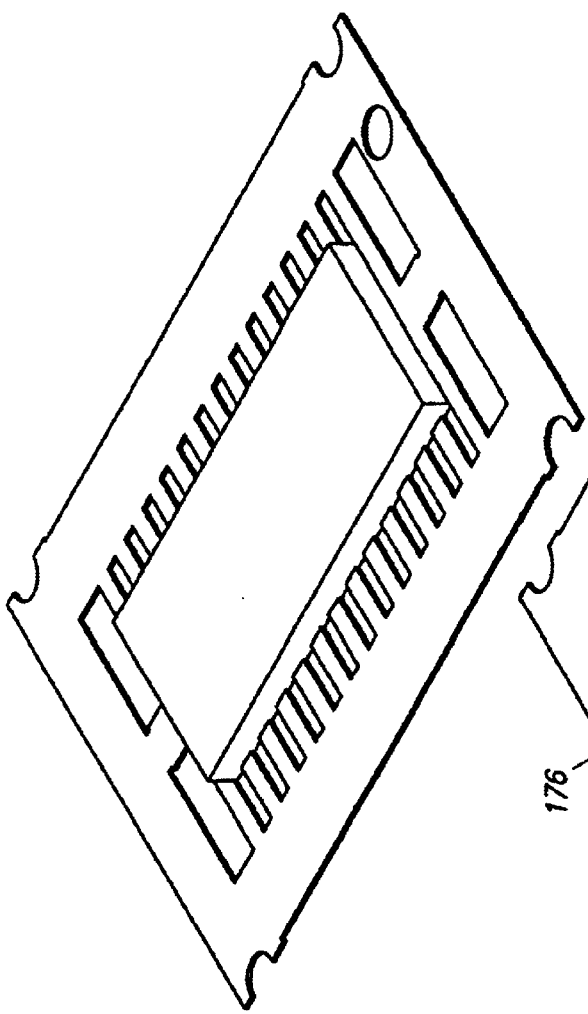
Figure 10B:
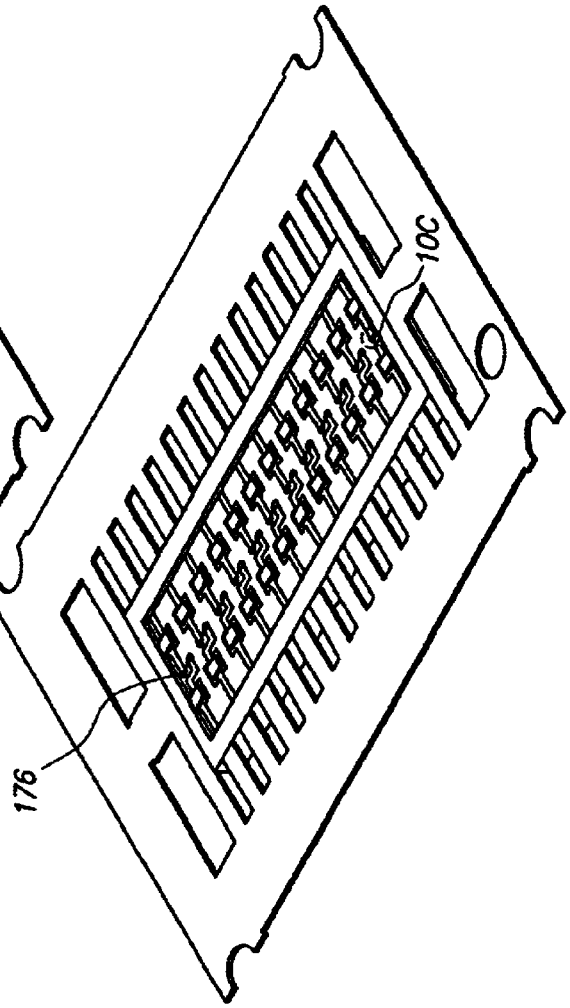

FIGS. 10A and 10B are top and bottom perspective views, respectively, of the structure after portions of adhesive 154 are selectively removed to form openings 176 in adhesive 154 that expose pads 116. Openings 176 are formed by applying a suitable etch that is highly selective of adhesive 154 with respect to pads 116 and routing lines 148.

In this instance, a selective laser etch is applied. Using projection laser ablation, a metal mask (not shown) is positioned relative to adhesive 154 such that openings in the metal mask are aligned with pads, and a laser is directed to the side of the metal mask opposite adhesive 154. Accordingly, the metal mask targets the laser at pads 116. The laser removes portions of adhesive 154 above pads 116 and outside routing lines 148. Openings 176 have a diameter of 100 microns, and pads 116 (with a length and width of 70 microns) are exposed by and axially aligned with openings 176. Routing lines 148 shield the underlying adhesive 154 from the laser etch so that the portions of adhesive 154 sandwiched between routing lines 148 and pads 116 remain intact. Openings 176 are formed in adhesive 154 without damaging pads 116, passivation layer 118 and routing lines 148. Thus, openings 176 extend through adhesive 154, but do not extend into chip 110.

Figure 10C:
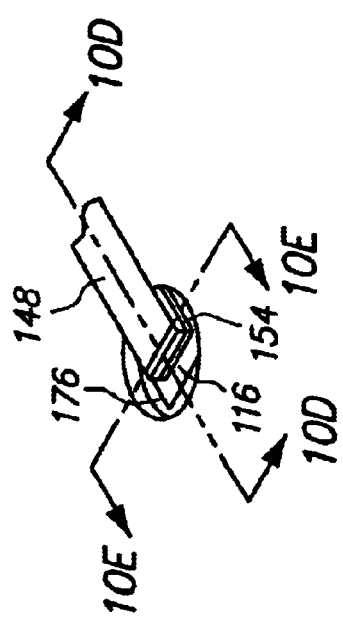
FIG. 10C is an enlarged perspective view of encircled detail 10C in FIG. 10B that shows a representative pad, routing line and opening in greater detail.
Figure 10D:
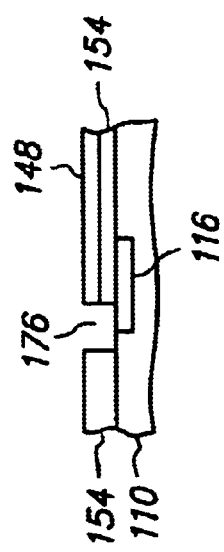
FIGS. 10D and 10E are enlarged cross-sectional views taken across lines 10D—10D and 10E—10E, respectively, in FIG. 10C.
Figure 10E:
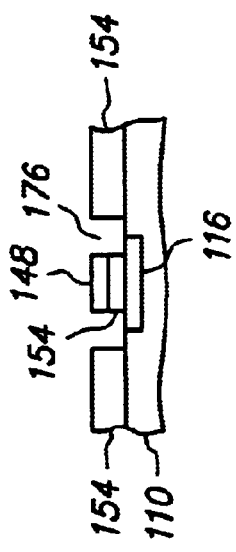

FIG. 10C is an enlarged perspective view of encircled detail 10C in FIG. 10B that shows a representative pad 116, routing line 148 and opening 176 in greater detail, and FIGS. 10D and 10E are enlarged cross-sectional views taken across lines 10D—10D and 10E—10E, respectively, in FIG. 10C.

FIGS. 11A and 11B are top and bottom perspective views, respectively, of connection joints 180 formed on pads 116 and routing lines 148 by ball bonding.

Connection joints 180 are formed in openings 176 and contact pads 116 and routing lines 148, thereby electrically connecting pads 116 and routing lines 148. Connection joints 180 are composed of gold and are formed by thermosonic wire bonding. Preferably, the regions of pads 116 and routing lines 148 that are within or exposed by openings 176 are spot plated with silver having a thickness 3 microns. Silver is particularly well-suited for receiving a gold ball bond connection joint, and the nickel between the silver and the copper prevents the formation of brittle silver-copper intermetallic compounds. Thereafter, a capillary with a gold wire ball is positioned above opening 176, the capillary moves downward such that the wire ball enters opening 176 and contacts pad 116 and routing line 148 while the capillary is heated to about 150 to 200° C., and the capillary exerts a downward force of about 25 to 45 grams and provides horizontal ultrasonic oscillatory motions with a frequency of about 60 to 120 kHz. The combination of heat, pressure and ultrasonic vibration places the wire ball in a soft state which is easy to deform and forms a ball bond that contacts and is metallurgically bonded to pad 116 and routing line 148. Thereafter, the capillary moves upward and away from the ball bond without exerting upward pressure on the ball bond, and the ball bond cools and solidifies. The solidified ball bond forms connection joint 180 and the capillary moves in a horizontal loop and then downward with a force of 70 to 90 grams to cut the gold wire from connection joint 180. The process is repeated to form other connection joints 180 for corresponding pairs of pads 116 and routing lines 148.

Connection joints 180 are formed in openings 176 and contact and electrically connect pads 116 with routing lines 148. Connection joints 180 contact and cover portions of pads 116 beneath openings 176 and outside routing lines 148, the surfaces of routing lines 148 that overlap and face away from pads 116, and the outer edges (or three peripheral sidewalls) of routing lines 148 that overlap and are orthogonal to pads 116. Thus, connection joints 180 provide robust, permanent electrical connections between pads 116 and routing lines 148.

Connection joints 180 are the only electrical conductors external to chip 110 that contact pads 116, adhesive 154 and connection joints 180 are the only materials external to chip 110 that contact pads 116, and adhesive 154 and connection joints 180 are the only materials that contact both pads 116 and routing lines 148.

Figure 11C:
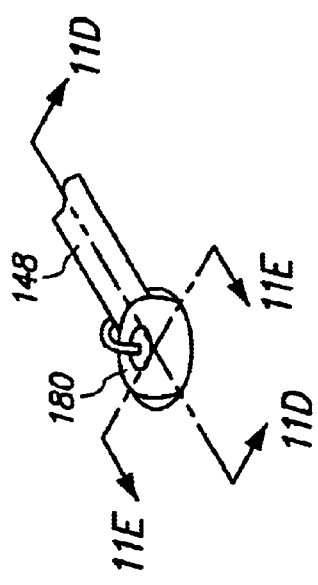
FIG. 11C is an enlarged perspective view of encircled detail 11C in FIG. 11B that shows a representative pad, routing line, opening and connection joint in greater detail.
Figure 11D:
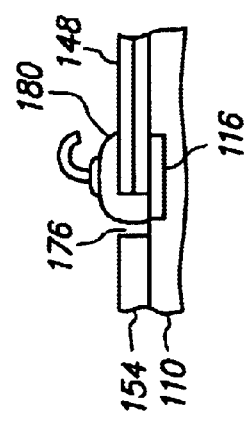
FIGS. 11D and 11E are enlarged cross-sectional views taken across lines 11D—11D and 11E—11E, respectively, in FIG. 11C.
Figure 11E:
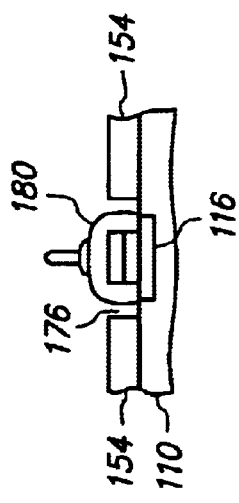

FIG. 11C is an enlarged perspective view of encircled detail 11C in FIG. 11B that shows a representative pad 116, routing line 148, opening 176 and connection joint 180 in greater detail, and FIGS. 11D and 11E are enlarged cross-sectional views taken across lines 11D—11D and 11E—11E, respectively, in FIG. 11C.

FIGS. 12A and 12B are top and bottom perspective views, respectively, of insulative base 182 disposed on the structure. Insulative base 182 is initially an epoxy paste that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is deposited on the exposed portions of metal traces 144, adhesive 154 and connection joints 180 using stencil printing. The epoxy paste is compliant enough at room temperature to conform to virtually any shape, and therefore fills the remaining space in openings 176. Thereafter, the epoxy paste is cured or hardened at relatively low temperature in the range of 100–250° C. to form insulative base 182 as a solid single-piece epoxy layer. Thereafter, a brief oxygen plasma cleaning step is applied to remove any epoxy residue on terminals 146 without removing an appreciable amount of encapsulant 156 or insulative base 182. Therefore, terminals 146 are exposed and available for connection to the next level assembly.

Insulative base 182 has a planar top surface and a thickness of 50 microns relative to adhesive 154. Therefore, terminals 146 protrude 70 microns (120–50) below and extend through insulative base 182.

Insulative base 182 contacts portions of inner side surfaces 174 adjacent to adhesive 154 and covers the entire surface area formerly occupied by central portion 126. As a result, encapsulant 156 and insulative base 182 in combination form insulative housing 184 that surrounds and encapsulates chip 110. Insulative housing 184 includes bottom surface 164 formed by peripheral portion 166 and insulative base 182. Thus, peripheral portion 166 forms a rectangular peripheral ledge of bottom surface 164, and insulative base 182 forms a recessed central portion of bottom surface 164.

Peripheral portion 166 and insulative base 182 form cavity 185. Cavity 185 is bound by inner side surfaces 174 and insulative base 182. Cavity 185 has a rectangular periphery defined by inner side surfaces 174, and a surface area within its periphery that corresponds to the surface area of insulative base 182 as well as the surface area formerly occupied by central portion 126. Chip 110 is within the periphery of cavity 185 and outside cavity 185, and terminals 146 protrude downwardly from insulative base 182 into cavity 185.

In addition, since terminals 146 protrude downwardly from insulative base 182, terminals 146 protrude downwardly from bottom surface 164. Peripheral portion 166 protrudes 150 microns (200–50) below insulative base 182, whereas terminals 146 protrude 70 microns below insulative base 182. Thus, peripheral portion 166 protrudes about twice as far below insulative base 182 as terminals 146 protrude below insulative base 182. However, since insulative base 182 forms a central portion of bottom surface 164 of insulative housing 184, and terminals 146 protrude below insulative base 182, terminals 146 protrude below bottom surface 164 of insulative housing 184, even though peripheral portion 166 forms a peripheral ledge of bottom surface 164 that protrudes below terminals 146.

Figure 13A:
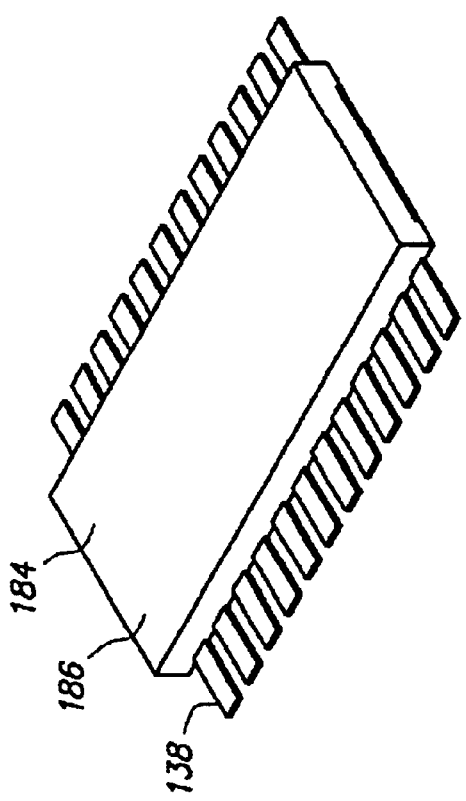
Figure 13B:
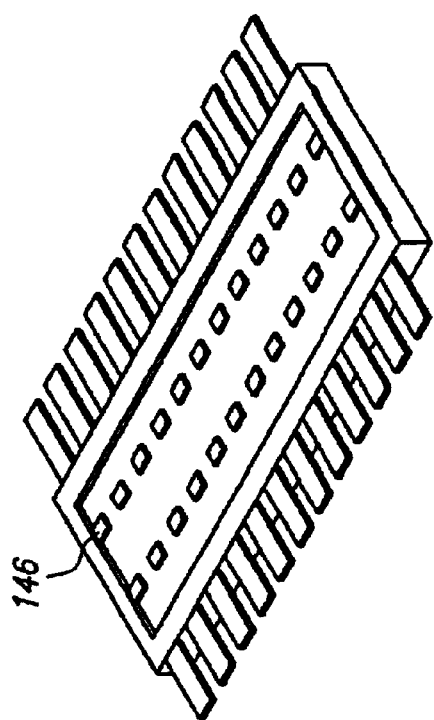

FIGS. 13A and 13B are top and bottom perspective views, respectively, of the structure after metal base 120 outside leads 138 and insulative housing 184 is removed. In other words, metal base 120 is selectively cut to remove all portions of metal base 120, except for leads 138, outside insulative housing 184, while leads 138 and insulative housing 184 remain intact. This can be accomplished using an excise blade that selectively cuts metal base 120 at predetermined regions adjacent to leads 138 and insulative housing 184. As a result, mother device 186 is singulated from the lead frame.

At this stage, mother device 186 includes chip 110, conductive traces 150, adhesive 154, connection joints 180 and insulative housing 184. Conductive traces 150 each include a lead 138 that protrudes laterally from and extends through a side surface 162 of insulative housing 184, a terminal 146 that protrudes downwardly from and extends through bottom surface 164 of insulative housing 184, and a routing line 148 within insulative housing 184 that is integral with an associated terminal 146 and contacts an associated lead 138 and connection joint 180. Conductive traces 150 are electrically connected to pads 116 by connection joints 180 in one-to-one relation, and are electrically isolated from one another. Leads 138 are arranged in opposing rows that protrude laterally from and extend through opposing side surfaces 162 and are disposed between top surface 160 and bottom surface 164. Terminals 146 are arranged as an array that protrudes downwardly from and extends through bottom surface 164 and is disposed inside inner side surfaces 174. Furthermore, leads 138 and terminals 146 are spaced and separated from one another outside insulative housing 184, and leads 138 and terminals 146 are electrically connected to one another and to pads 116 inside insulative housing 184 and outside chip 110.

Figure 14A:
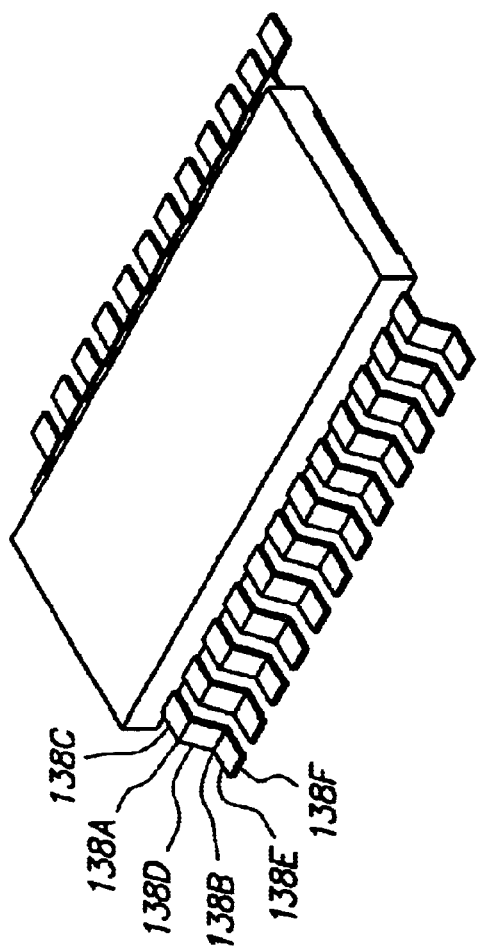
Figure 14B:
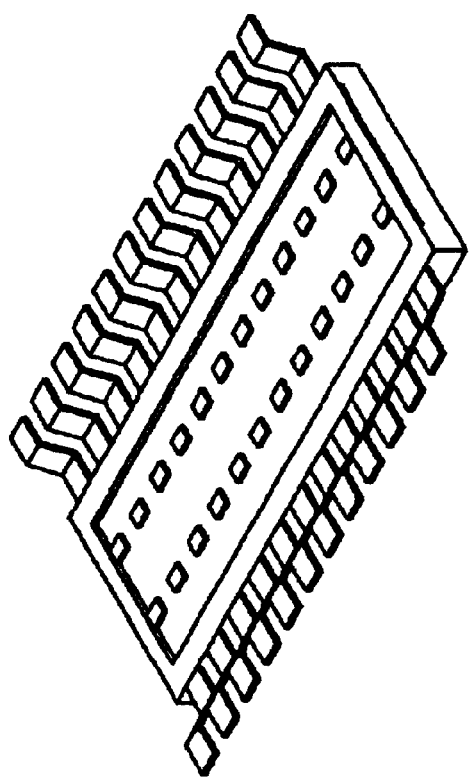

FIGS. 14A and 14B are top and bottom perspective views, respectively, of mother device 186 after leads 138 are bent. Leads 138 are bent at inner corners 138A and outer corners 138B using a conventional lead forming tool. As a result, leads 138 include inner lateral portions 138C between inner corners 138A and insulative housing 184, vertical portions 138D between corners 138A and 138B, and outer lateral portions 138E between outer corners 138B and distal ends 138F. Lateral portions 138C and 138E are parallel to top surface 160 and parallel to one another. Vertical portions 138D are sloped and extend laterally away from inner lateral portions 138C with increasing vertical distance from inner lateral portions 138C. Outer lateral portions 138E are disposed beneath terminals 146 and bottom surface 164. Thus, the lead bending operation moves distal ends 138F from between top surface 160 and bottom surface 164 to outside top surface 160 and bottom surface 164 such that distal ends 138F extend vertically beyond insulative housing 184. Furthermore, the lead bending operation converts leads 138 from straight planar leads to gullwing-shaped TSOP leads.

Figure 14C:
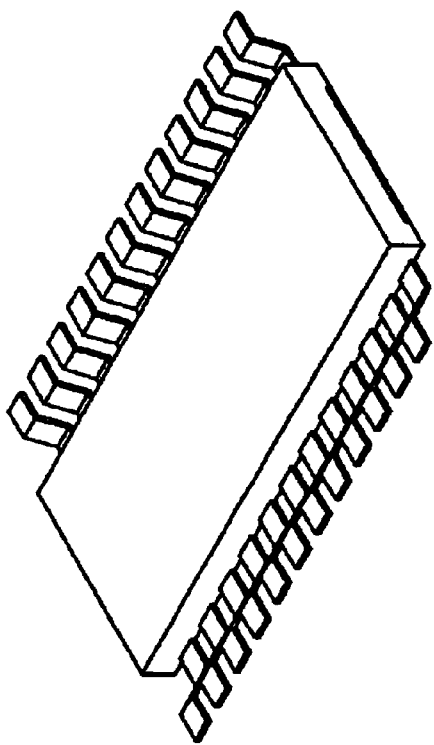
FIGS. 14C and 14D are top and bottom perspective views, respectively, that show an alternative arrangement to FIGS. 14A and 14B in which the leads are bent in the opposite direction.
Figure 14D:
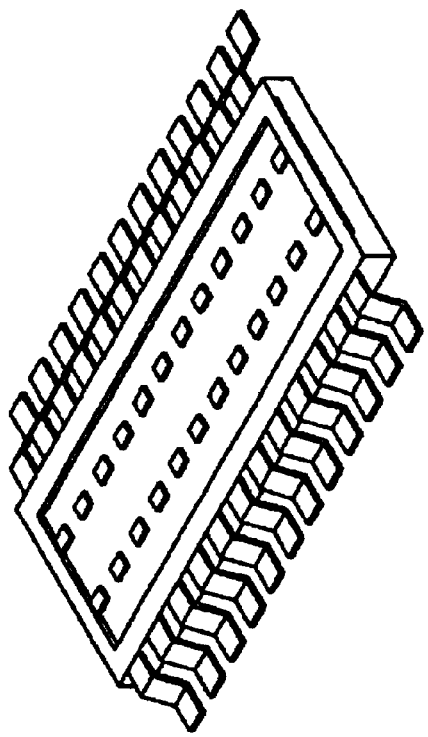

FIGS. 14C and 14D are top and bottom perspective views, respectively, of an alternative arrangement to FIGS. 14A and 14B in which leads 138 are bent in the opposite direction.

Advantageously, the mother device has a first electrode configuration for a test socket and the next level assembly and a second electrode configuration for vertical interconnection with a daughter device, such as a chip or a chip scale package, that is subsequently mounted in the cavity. The first electrode configuration is provided by the leads, and the second electrode configuration is provided by the terminals. As a result, the mother device is flexible enough to accommodate test sockets and printed circuit boards with different electrical contact requirements than the daughter device. In other words, the leads can be optimized for mating with the test socket and the next level assembly, and the terminals can be optimized for mating with daughter device. In this manner, the mother device can be tested using a standard test socket and then attached to a printed circuit board with entirely different contact arrangements than the daughter device.

Figure 15A:
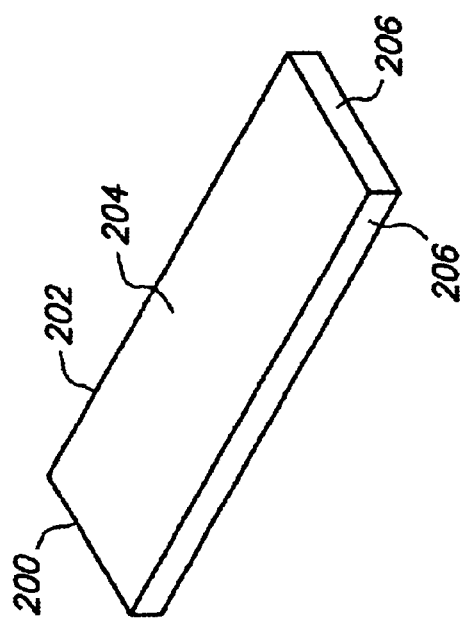
Figure 15B:
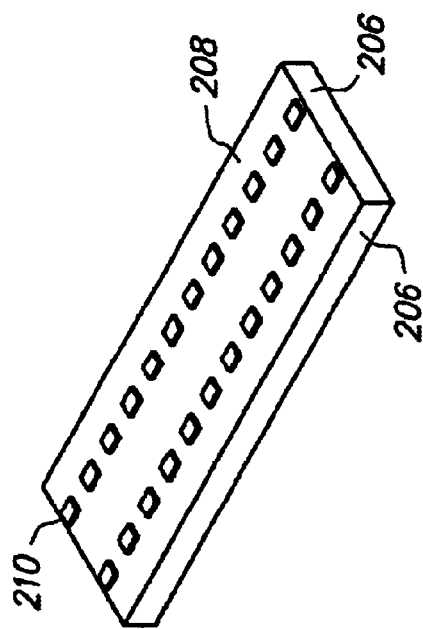

FIGS. 15A and 15B are top and bottom perspective views, respectively, of daughter device 200. Daughter device 200 is a chip scale package that includes insulative housing 202 with top surface 204, peripheral side surfaces 206 and bottom surface 208, a semiconductor chip (not shown) within insulative housing 202, and terminals 210 that extend through and protrude from bottom surface 208. Terminals 210 are electrically connected to the pads of the chip within insulative housing 202 in one-to-one relation.

Figure 16A:
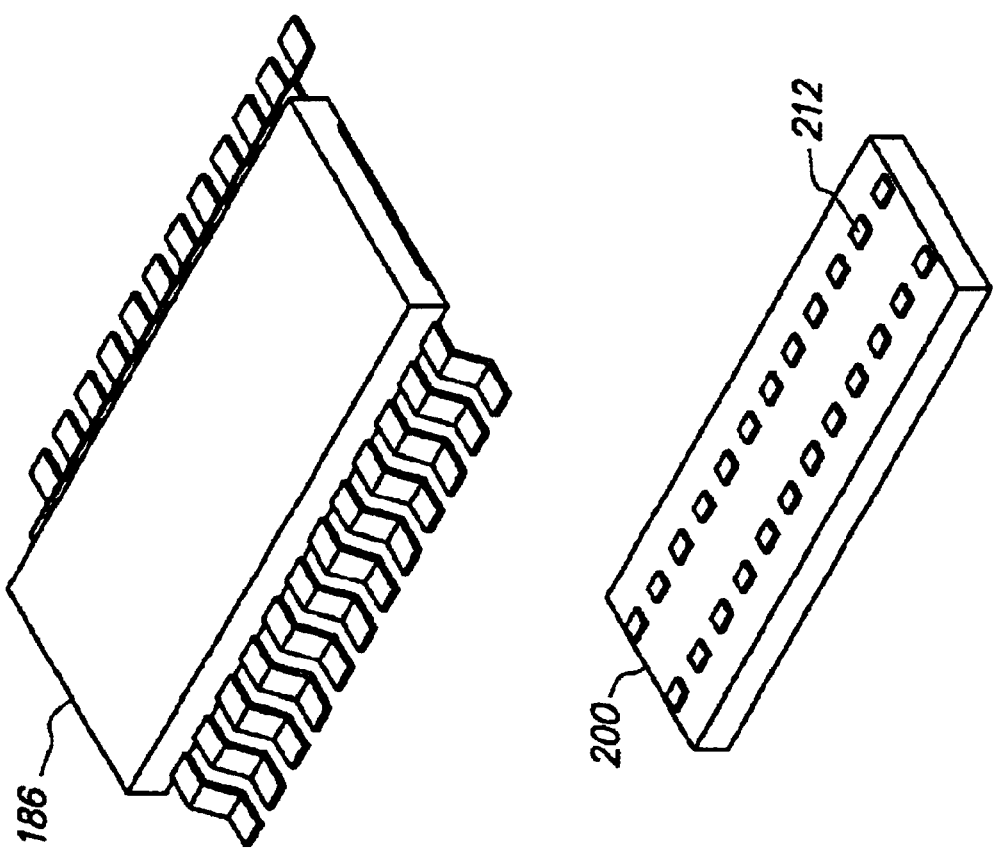
Figure 16B:
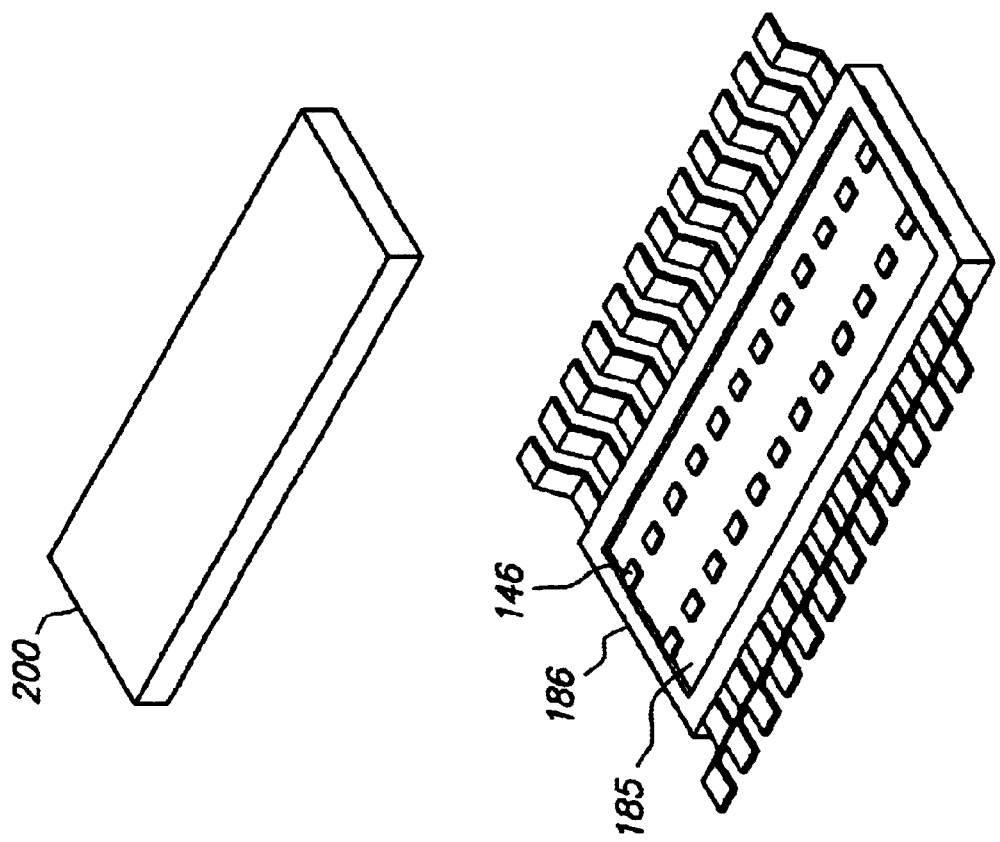

FIGS. 16A and 16B are top and bottom perspective views, respectively, of devices 186 and 200 with solder paste portions 212 deposited on terminals 210. Solder paste portions 212 include finely powdered tin-lead solder particles mixed in a viscous organic resin containing a fluxing agent. Solder paste portions 212 are deposited on terminals 210 using stencil printing. During the stencil printing process, a stencil (not shown) is placed over device 200, stencil openings are aligned with terminals 210, and then a squeegee (not shown) pushes the solder paste along the surface of the stencil opposite device 200, through the stencil openings and onto terminals 210.

At this stage, devices 186 and 200 are positioned relative to one another so that device 200 is positioned within the periphery of cavity 185 and does not extend outside the periphery of cavity 185, terminals 146 and 210 are vertically aligned with one another in one-to-one relation, and device 186 covers most but not all of the surface area of cavity 185. However, device 200 does not extend into cavity 185, and solder paste portions 212 do not contact terminals 146.

Figures 17A, 17B:
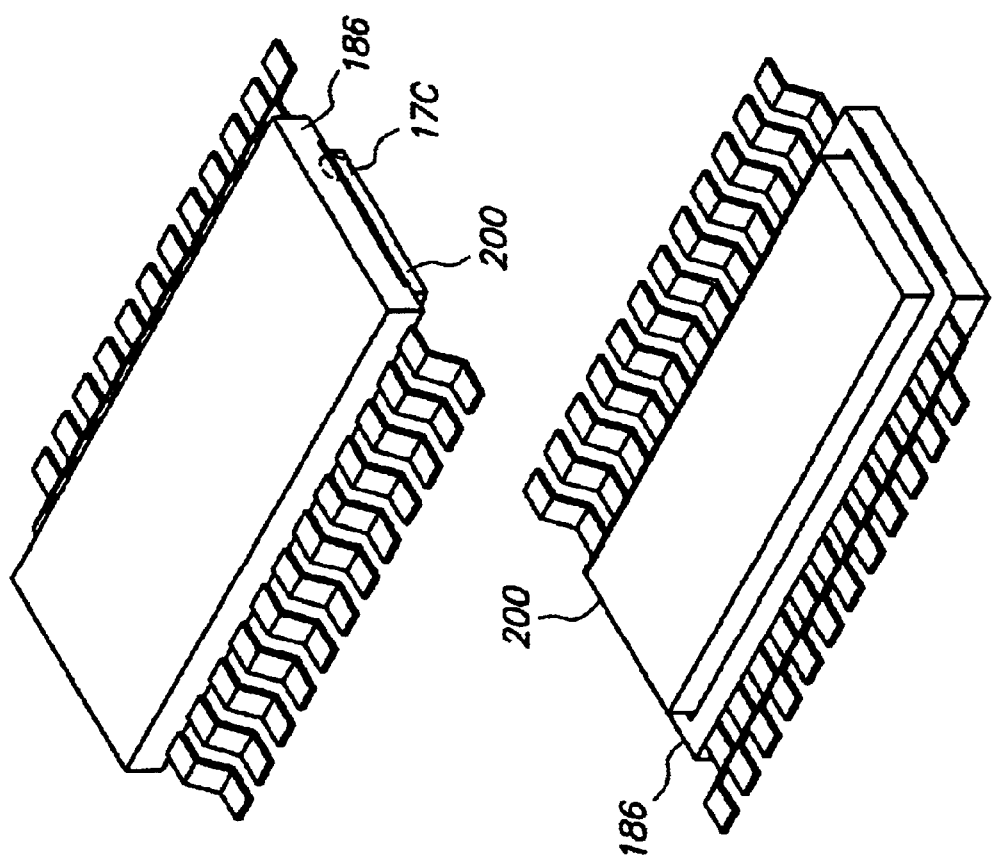

FIGS. 17A and 17B are top and bottom perspective views, respectively, of devices 186 and 200 mechanically and electrically connected to one another by conductive bonds 214. Devices 186 and 200 are positioned relative to one another so that device 200 is positioned within the periphery of cavity 185 and does not extend outside the periphery of cavity 185, terminals 146 and 210 are vertically aligned with one another in one-to-one relation, and device 200 covers most but not all of the surface area of cavity 185. In addition, device 200 extends into cavity 185, and conductive bonds 214 contact and electrically connect terminals 146 and 210. As a result, bottom surface 208 and terminals 210 are located inside cavity 185, and side surfaces 206 extend into cavity 185 and face towards, are adjacent to and are slightly spaced from inner side surfaces 174.

Devices 186 and 200 can be aligned and moved towards one another using an automated pattern recognition system so that solder paste portions 212 are sandwiched between terminals 146 and 210 using relatively low pressure. The pressure moves terminals 146 and 210 towards one another after solder paste portions 212 contact both, and solder paste portions 212 deform and are squeezed outside the narrowing gaps between terminals 146 and 210. Thereafter, the pressure is removed. Solder paste portions 212 are sufficiently viscous to provide a weak adherent bond between devices 186 and 200.

Thereafter, heat is applied to reflow solder paste portions 212, and then the heat is removed so that the molten solder particles cool and solidify into hardened solder joints that provide conductive bonds 214.

Solder paste portions 212 have a mass that falls within a narrow tolerance so that there is enough solder to wet terminals 146 and 210 during the reflow operation and form conductive bonds 214 with sufficiently large contact area to provide robust mechanical and electrical connections between terminals 146 and 210 without providing enough solder to create bridges or electrical shorts between adjacent conductive bonds 214.

It should also be noted that the heights of terminals 146 and 210 may vary due to processing variations, such as etch rate variations during the formation of recessed portions 130 that cause depth variations in recessed portions 130, which in turn cause height variations in terminals 146, and consequently gap variations between vertically aligned pairs of terminals 146 and 210. Advantageously, the compliant and deformable nature of solder paste portions 212 provides for flexible vertical interconnections that can accommodate a wide range of gap variations between terminals 146 and 210, and the process need not be adjusted or customized (e.g., trimming the terminal heights) to accommodate these variations. As a result, the process is well-suited for cost-effective volume production.

Figure 17C:
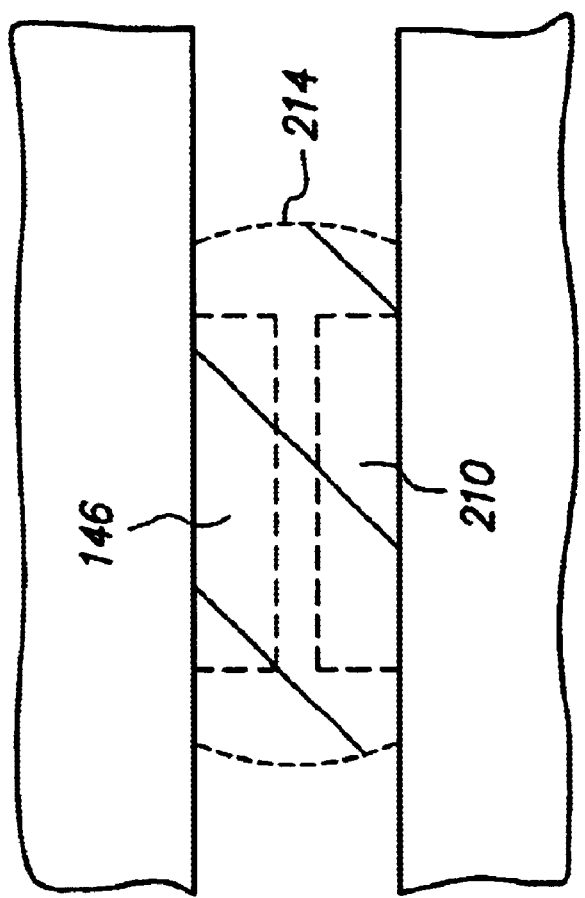
FIG. 17C is an enlarged side view of encircled detail 17C in FIG. 17A that shows a representative conductive bond, first device terminal and second device terminal in greater detail.

FIG. 17C is an enlarged side view of encircled detail 17C in FIG. 17A that shows a representative conductive bond 214 and terminals 146 and 210 in greater detail. Since conductive bond 214 and terminals 146 and 210 are not visible from the outer side surface, they are shown in phantom.

Figure 18A:
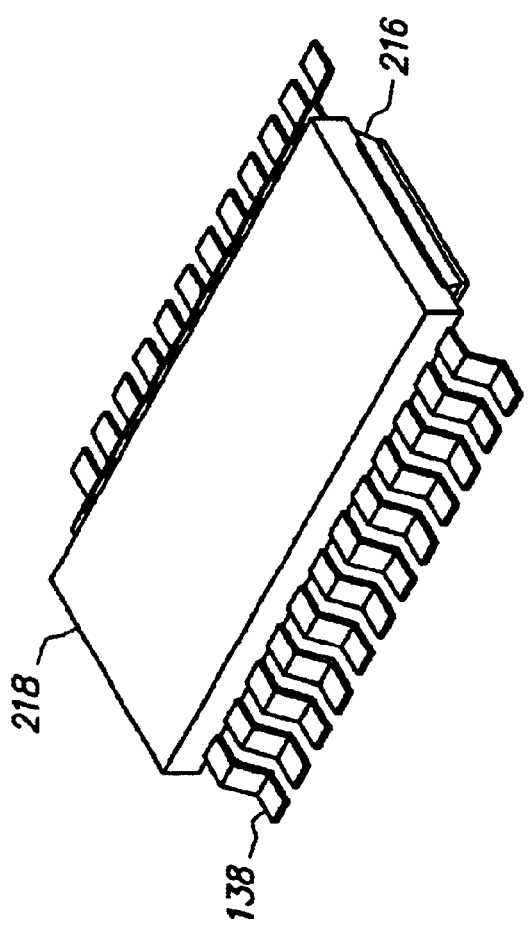
Figure 18B:
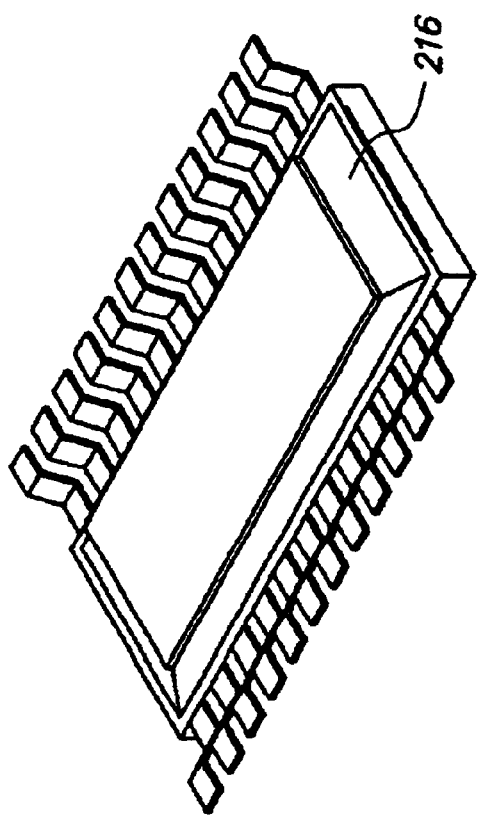

FIGS. 18A and 18B are top and bottom perspective views, respectively, of insulative coating 216 formed on the structure by transfer molding. Coating 216 fills the remaining space in cavity 185 and covers the exposed surfaces of device 200. Coating 216 is a solid adherent protective insulator that provides environmental protection for conductive bonds 214, reduces the mechanical stress on conductive bonds 214 and enhances the mechanical attachment between devices 186 and 200.

At this stage, the manufacture of multichip semiconductor package device 218 that includes mother device 186, daughter device 200, conductive bonds 214 and coating 216 can be considered complete. Devices 186 and 200 are mechanically coupled by conductive bonds 214 and coating 216, and are electrically coupled by conductive bonds 214. Devices 186 and 200 are compactly mated with device 200 inserted into cavity 185. Leads 138 extend vertically beyond coating 216 and provide electrodes for the next level assembly. Terminals 146 and 210 and conductive bonds 214 are within the peripheries of chip 110 and the other chip, thereby providing short signal paths between the chips. Conductive bonds 214 provide robust electrical connections between terminals 146 and 210 that are not affected by height variations in terminals 146 and 210.

The multichip semiconductor package device described above is merely exemplary. Numerous other embodiments are contemplated.

Figure 19:
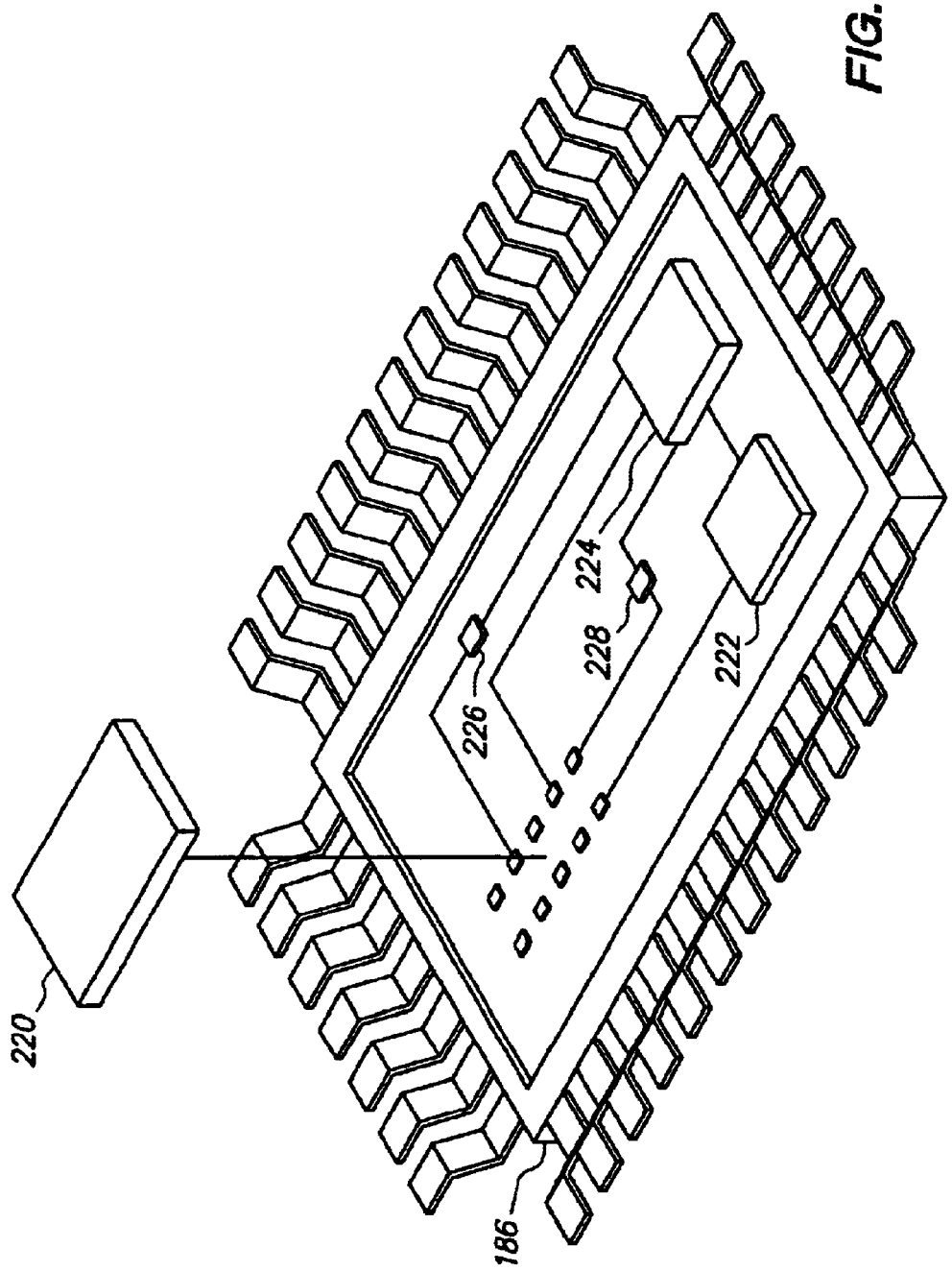
FIG. 19 shows another embodiment of the multichip semiconductor package device in which multiple devices are mounted in the cavity.

The mother device can have multiple daughter devices mounted in the cavity, such as chips 220, 222 and 224 and capacitors 226 and 228 (FIG. 19). Similarly, the daughter devices can be interconnected by additional routing lines between selected terminals of the mother device, and the additional routing lines can be inside, outside or extend through the insulative housing.

The daughter device can be an unpackaged chip, a chip scale package or other semiconductor package devices.

The conductive traces can have various shapes and sizes. The conductive traces can overlap various portions of the pads, such as one peripheral edge and the center of the pad (FIG. 10C), two opposing peripheral edges and the center of the pad, three peripheral edges but not the center of the pad, two corners and the center of the pad, or four peripheral edges but not the center of the pad.

The conductive traces can be various conductive metals including copper, gold, nickel, aluminum, palladium, tin, combinations thereof, and alloys thereof. The preferred composition of the conductive traces will depend on the nature of the connection joints as well as design and reliability factors. Furthermore, those skilled in the art will understand that in the context of a semiconductor package device, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive traces may function as a signal, power or ground layer depending on the purpose of the associated chip pads. Likewise, the conductive traces can fan-in and fan-out.

The metal traces can be a single layer or multiple layers. For instance, the metal trace can be a 5 micron layer of gold, or alternatively, a 4.5 micron layer of nickel electroplated on a 0.5 micron layer of gold electroplated on a copper base to reduce costs, or alternatively, a 4 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the metal trace can include a non-copper layer between a copper layer and the metal base. Suitable non-copper layers include nickel, gold, palladium and silver. After the metal trace is attached to the chip by the adhesive, a wet chemical etch can be applied that is highly selective of copper with respect to the non-copper layer to remove the copper base without removing the copper or non-copper layers. The non-copper layer provides an etch stop that prevents the wet chemical etch from removing the copper layer. Furthermore, it is understood that in the context of the present invention, the metal trace and the metal base are different metals (or metallic materials) even if a multi-layer metal trace includes a single layer that is similar to the metal base (such as the example described above).

The metal base can be various metals such as copper, gold, nickel, aluminum, palladium, tin, combinations thereof, and alloys thereof, and can be a single layer or multiple layers.

The metal base can be etched in numerous manners. For instance, portions of the metal base above the pads can be selectively etched to permit formation of the openings in the adhesive, and other portions of the metal base can remain intact and connected to the conductive traces. Alternatively, portions of the metal base above the pads can be selectively etched to permit formation of the openings, and other portions of the metal base that are isolated from the conductive traces and disposed within the periphery of the chip can remain intact and provide heat sinks.

The insulative base can be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. Organic fiber reinforcement may also be used in the epoxy resin. Fibers that may be used include aramid, polyester, polyamide, poly-ether-ether-ketone, polyimide, polyetherimide and polysulfone. The fiber reinforcement can be woven fabric, non-woven fabric or paper. Commercially available dielectric materials such as SPEED-BOARD C prepreg by W.L. Gore & Associates of Eau Claire, Wis. are suitable.

The insulative base can initially be formed outside the terminals such that the terminals are exposed. Alternatively, the insulative base can be deposited as an insulative layer that covers the terminals, and then portions of the insulative layer that cover the terminals can be selectively removed using a laser etch to expose the terminals without exposing portions of the routing lines that contact the leads. As another alternative, the insulative base can be deposited as an insulative layer that covers the terminals, and then a surface portion of the insulative layer can be globally removed using a plasma etch to expose the terminals without exposing portions of the routing lines that contact the leads.

The insulative base can fill some or all of the remaining space in the cavity and can be recessed relative to, aligned with or protrude from the peripheral ledge. As a result, the daughter device may extend into or be entirely outside the cavity.

The pads can have numerous shapes including a flat rectangular shape and a bumped shape. For instance, a bump-shaped pad may extend into the opening and may even extend above the conductive trace. The pads can either be partially or completely exposed prior to forming the connection joints. The pads can have a length and width that are larger than, equal to, or smaller than the diameter of the openings. Preferably, the pads and openings have the same or similar size, and a substantial portion of the pads is directly beneath the openings.

Numerous adhesives can be applied between the chip and the conductive trace. For instance, the adhesive can be applied as a paste, a laminated layer, or a liquid applied by screen-printing, spin-on, or spray-on. If paste or liquid adhesives are applied, the adhesive may contact the metal base, whereas if laminated adhesives are applied then no appreciable amount of adhesive may contact the metal base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable.

The openings can be formed in the adhesive either before or after mechanically attaching the chip to the conductive traces. For instance, the adhesive can be applied as a liquid or paste (A stage) to the bottom surface of the conductive traces, the adhesive can be partially cured (B stage), a back-side etch can form the openings in the adhesive, the partially cured adhesive can be brought into contact with the chip, and then the adhesive can be fully cured (C stage). Alternatively, the liquid or paste adhesive can be sandwiched between the chip and the conductive traces, the adhesive can be fully cured thereby mechanically fastening the chip to the conductive traces, and then a front-side etch can form the openings in the adhesive.

The openings can be formed with numerous etching techniques. For instance, the openings can be formed by laser direct write (without a mask) or a blanket plasma etch that removes portions of the adhesive not covered by the conductive traces. In addition, the openings can have a circular, ovalar, square, rectangular or other shape. The openings may be aligned with and expose single pads or a plurality of pads. Furthermore, the openings can have sidewalls with a wide variety of shapes and slopes including vertical sidewalls, tapered sidewalls, continuous sidewalls and stepped sidewalls.

The encapsulant can be formed using a wide variety of techniques including printing and transfer molding. For instance, the encapsulant can be an epoxy paste that is deposited and then cured or hardened. The encapsulant can be any of the adhesives mentioned above. Moreover, the encapsulant need not necessarily contact the chip. For instance, a glob-top coating can be deposited on the chip after mechanically attaching the chip to the conductive traces, and then the encapsulant can be formed on the glob-top coating.

The connection joints can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joints depends on the composition of the conductive traces as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

The conductive traces can be formed and attached to the chip by a wide variety of lead-on-chip (LOC) and other connection techniques. See, for instance, U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," U.S. application Ser. No. 09/878,626 filed Jun. 11, 2001 by Charles W. C. Lin entitled "Method of Connecting a Conductive Trace to a Semiconductor Chip," U.S. application Ser. No. 09/939,140 filed Aug. 24, 2001 by Charles W. C. Lin entitled "Semiconductor Chip Assembly with Interlocked Conductive Trace," and U.S. application Ser. No. 09/962,754 filed Sep. 24, 2001 by Charles W. C. Lin entitled "Method of Connecting a Conductive Trace and an Insulative Base to a Semiconductor Chip," each of which is incorporated by reference. Conventional wire bonding, TAB and flip-chip techniques can also be employed. With conventional wire bonding, TAB and flip-chip techniques, the connection joints between the conductive traces and the pads can be formed before the encapsulant is formed.

The terminals can have a wide variety of shapes and sizes and can be formed by a wide variety of techniques. See, for instance, U.S. application Ser. No. 09/972,796 filed Oct. 6, 2001 by Charles W. C. Lin et al. entitled "Method of Connecting a Bumped Compliant Conductive Trace and an Insulative Base to a Semiconductor Chip," and U.S. application Ser. No. 09/997,973 filed Nov. 29, 2001 by Charles W. C. Lin et al. entitled "Method of Connecting a Bumped Conductive Trace to a Semiconductor Chip," each of which is incorporated by reference. The terminals can be integral with or attached to the routing lines. For instance, the terminals can be solder balls deposited on planar routing lines. The terminals may include or exclude cavities, and can resemble columns, pillars, pins, bumps, balls, spheres, hemispheres or other shapes.

The terminals can protrude from or be aligned with the insulative housing. For instance, the terminals can be aligned with the routing lines by omitting the recessed portions from the surface of the metal base upon which the conductive traces are deposited, and the insulative base can be omitted so that the adhesive provides the recessed central portion of the bottom surface of the insulative housing. In this manner, the terminals are aligned with the bottom surface of the insulative housing.

The terminals can be disposed inside or outside the periphery of the chip, and if inside the periphery of the chip, over a peripheral portion of the chip outside the pads or over a central portion of the chip inside the pads. Thus, the terminals can fan-in and fan-out relative to the pads.

A soldering material or solder balls can be deposited on the terminals by plating or printing or placement techniques. Moreover, the terminals can be formed with a solder surface layer, thereby rendering additional soldering material unnecessary.

The conductive bonds can be formed from a wide variety of materials and processes and can have a wide variety of shapes and sizes. Preferably, the conductive bonds are formed by contacting a non-solidified material to the terminals of the mother and daughter devices and then applying energy to transform the non-solidified material into the conductive bonds. More preferably, the conductive bonds are formed by solder reflowing or conductive adhesive curing.

Conductive bonds formed by solder reflowing involve depositing a non-solidified solder-containing material and then applying energy to reflow the solder and form hardened solder joints. Suitable solder-containing materials include solder paste, liquid solder and solder particles. The solder can be a tin-lead alloy, although lead-free compositions such as tin-bismuth are becoming increasingly popular due to environmental concerns over lead usage in the electronics industry. Suitable deposition processes include screen printing, stencil printing, meniscus coating, liquid solder jetting and solder particle placement. Heat can be supplied by a convection oven, although other techniques such as infrared (IR) continuous belt reflow, hot nitrogen gas, a laser beam and vapor-phase reflow can be used. The preferred deposition and reflow techniques depend on the solder-containing material employed.

Conductive bonds formed by conductive adhesive curing involve depositing a non-solidified conductive adhesive and then applying energy to cure the conductive adhesive and form hardened conductive adhesive joints. Suitable conductive adhesives include (1) a polymer binder (or matrix) and a filler metal powder, and (2) intrinsic conductive polymer. For instance, conductive epoxy paste includes an epoxy binder and silver flakes. Isotropic conductive adhesives in which the electrical conductivity is identical along the three coordinate axes are generally preferred. Suitable deposition processes include screen printing and stencil printing. Heat can be supplied by a convection oven, although other energy sources such as microwaves and UV light can be used. The preferred deposition and curing techniques depend on the conductive adhesive employed.

The insulative coating can be formed using a wide variety of techniques and a wide variety of insulative materials. The insulative coating can fill the remaining space in the cavity and encapsulate the daughter device, or fill the remaining space in the cavity without encapsulating the daughter device, or fill the remaining space in the cavity between the bottom surfaces of the mother and daughter devices without filling the other remaining space in the cavity or extending outside the cavity. In addition, the insulative coating can be formed before or after the conductive bonds are formed. For instance, if the conductive bonds are solder joints formed from solder paste that provides an adherent bond between the mother and daughter devices then the insulative coating can be formed after the solder reflow operation. Alternatively, if the conductive bonds are solder joints formed from plated solder that does not provide an adherent bond between the mother and daughter devices then the insulative coating can be formed before the solder reflow operation. Furthermore, in some instances the insulative coating can be omitted. For instance, the devices can be sized so that outer side surfaces of the daughter device contact inner side surfaces of the peripheral ledge of the mother device, thereby providing a compression fit between the devices. Alternatively, the conductive bonds alone may provide adequate mechanical strength.

The mother and daughter devices can differ in various respects. For instance, the devices can house different types of chips. The daughter device can be thinner than the mother device so that the entire daughter device fits within the cavity of the mother device. The mother or daughter device can have solder-coated bumped terminals that protrude from the bottom surface of its insulative housing, and the other device can have terminals that are aligned with the bottom surface of its insulative housing.

The testing operation can be performed on the mother device, the daughter device, the mother and daughter devices, or neither the daughter nor mother device, before the multichip device is formed. Similarly, the testing operation can be performed or skipped on the multichip device. For instance, the mother and daughter devices can be tested before the multichip device is formed, and then the multichip device can bypass testing. Alternatively, the mother and daughter devices can bypass testing before the multichip device is formed, and then the multichip device can be tested. Preferably, the mother device is tested using a standard TSOP test socket either individually or with the daughter device after the multichip device is formed.

The "upper" and "lower" surfaces of the chip and the "top" and "bottom" surfaces of the insulative housing do not depend on the orientation of the device, as will be readily apparent to those skilled in the art. For instance, the upper surface of the chip includes the pads, regardless of whether the chip is inverted, and regardless of whether the device is inverted and/or mounted on a printed circuit board. Similarly, the terminals extend through the "bottom" surface of the insulative housing, and the leads extend through the "side" surfaces of the insulative housing, regardless of whether the device is inverted, rotated or slanted. Likewise, the device is shown with a single orientation throughout the drawings for ease of comparison between the figures, although the device may be inverted at various manufacturing stages. For instance, the device should be inverted so that the bottom surface faces upward when the epoxy paste that forms the insulative base is deposited on the structure to assist the epoxy paste with filling the remaining space in the openings in the adhesive.

The multichip device can house a wide variety of chips including microprocessors, field programmable gate arrays (FPGAs), logic drivers, dynamic random access memories (DRAMs), static random access memories (SRAMs) and optoelectronic chips.

The multichip device can have a wide variety of packaging formats as required by the test socket, the next level assembly and/or the vertical interconnections. For instance, the leads can be configured so that the multichip device is a surface mount technology (SMT) package such as a small outline package (SOP), thin small outline package (TSOP), quad flat package (QFP), plastic leadless chip carrier (PLCC) or small outline J-lead package (SOI). The leads can also be configured so that the multichip device is a through-hole package such as a dual in-line package (DIP), single in-line package (SIP) or zig-zag in-line package (ZIP). The terminals can be configured so that the daughter device is a grid array such as a ball grid array (BGA), column grid array (CGA), land grid array (LGA) or pin grid array (PGA).

Advantageously, the multichip device is reliable, inexpensive, compact, and has short signal paths between the chips. The multichip device can be manufactured without wire bonding, TAB or solder joints, although the process is flexible enough to accommodate these techniques if desired. The multichip device can have a wide variety of packaging formats as required by the next level assembly. As a result, the multichip device significantly enhances throughput, yield and performance characteristics compared to conventional packaging techniques. Moreover, the multichip device is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A multichip semiconductor package device, comprising:
   a first device that includes:
      an insulative housing with a top surface, a bottom surface, and a peripheral side surface between the top and bottom surfaces, wherein the bottom surface includes a peripheral ledge and a central portion that is recessed relative to the peripheral ledge, and the peripheral ledge and the central portion form a cavity;
      a first semiconductor chip within the insulative housing and outside the cavity, wherein the first chip includes an upper surface and a lower surface, and the upper surface includes a conductive pad; and
      a conductive trace that includes a terminal and a lead, wherein the terminal extends through the central portion, the lead protrudes laterally from and extends through the side surface, the terminal and the lead are spaced and separated from one another outside the insulative housing, and the terminal and the lead are electrically connected to one another and to the pad;
   a second device that includes a second semiconductor chip, wherein the second device extends into the cavity and is positioned within and does not extend outside a periphery of the cavity; and
   a conductive bond inside the cavity and on the terminal that contacts and electrically connects the first and second devices.

2. The multichip device of claim 1, wherein the insulative housing includes a first single-piece housing portion that contacts the lead and is spaced from the terminal and a second single-piece housing portion that contacts the first single-piece housing portion and the terminal.

3. The multichip device of claim 2, wherein the first single-piece housing portion provides the top surface, the side surface and the peripheral ledge, and the second single-piece housing portion provides the central portion.

4. The multichip device of claim 3, wherein the first single-piece housing portion contacts the lower surface.

5. The multichip device of claim 3, wherein the insulative housing consists of the first and second single-piece housing portions.

6. The multichip device of claim 1, wherein the terminal protrudes vertically from the central portion into the cavity.

7. The multichip device of claim 1, wherein the terminal is aligned with the central portion.

8. The multichip device of claim 1, wherein the terminal is within a periphery of the first chip.

9. The multichip device of claim 1, wherein the terminal is within a periphery of the second chip.

10. The multichip device of claim 1, wherein the first chip is within and does not extend outside the periphery of the cavity.

11. The multichip device of claim 1, wherein the first device is a single-chip package.

12. The multichip device of claim 1, wherein the first device is devoid of an electrical conductor that extends through the top surface.

13. The multichip device of claim 1, wherein the second device contacts the peripheral ledge.

14. The multichip device of claim 1, wherein the second device is spaced from the peripheral ledge.

15. The multichip device of claim 1, wherein the second device occupies a majority of the cavity.

16. The multichip device of claim 1, wherein the second device occupies a minority of the cavity.

17. The multichip device of claim 1, wherein the second device is the second chip.

18. The multichip device of claim 1, wherein the second device is a chip scale package.

19. The multichip device of claim 1, wherein the first device is a TSOP package, and the second device is a chip scale package.

20. The multichip device of claim 1, wherein the multichip device is devoid of wire bonds and TAB leads.

21. A multichip semiconductor package device, comprising:
   a first device that includes:
      an insulative housing with a top surface, a bottom surface, and a peripheral side surface between the top and bottom surfaces, wherein the bottom surface includes a peripheral ledge and a central portion that is recessed relative to the peripheral ledge, and the peripheral ledge and the central portion form a cavity;
      a first semiconductor chip within the insulative housing and outside the cavity, wherein the first chip includes a upper surface and a lower surface, the upper surface includes a conductive pad, the upper surface faces towards the bottom surface and faces away from the top surface, and the insulative housing contacts the lower surface; and
      a conductive trace that includes a terminal and a lead, wherein the terminal extends through the central portion, the lead protrudes laterally from and extends through the side surface, the terminal and the lead are spaced and separated from one another outside the insulative housing, and the terminal and the lead are electrically connected to one another and the pad;
   a second device that includes a second semiconductor chip, wherein the second device extends into the cavity and is positioned within and does not extend outside a periphery of the cavity; and
   a conductive bond inside the cavity and on the terminal that contacts and electrically connects the first and second devices.

22. The multichip device of claim 21, wherein the insulative housing consists of first and second single-piece housing portions, the first single-piece housing portion provides the top surface, the side surface and the peripheral ledge, contacts the lower surface and the lead and is spaced from the terminal, and the second single-piece housing portion provides the central portion and contacts the first single-piece housing portion and the terminal.

23. The multichip device of claim 21, wherein the terminal is within a periphery of the first chip and a periphery of the second chip.

24. The multichip device of claim 21, wherein the conductive bond is within a periphery of the first chip and a periphery of the second chip.

25. The multichip device of claim 21, wherein the first chip is within and does not extend outside the periphery of the cavity.

26. The multichip device of claim 21, wherein the first device is a single-chip package.

27. The multichip device of claim 21, wherein the second device is the second chip.

28. The multichip device of claim 21, wherein the second device is a chip scale package.

29. The multichip device of claim 21, wherein the first device is a TSOP package, and the second device is a chip scale package.

30. The multichip device of claim 21, wherein the multichip device is devoid of wire bonds and TAB leads.

31. A multichip semiconductor package device, comprising:
   a first device that includes:
      an insulative housing with a top surface, a bottom surface, and peripheral side surfaces between the top and bottom surfaces, wherein the bottom surface includes a peripheral ledge and a central portion, the peripheral ledge is integral with the side surfaces, the central portion is within the peripheral ledge, spaced from the side surfaces and recessed relative to the peripheral ledge, and the peripheral ledge and the central portion form a cavity;
      a first semiconductor chip within and surrounded by the insulative housing and outside the cavity, wherein the first chip includes an upper surface and a lower surface, the upper surface includes a conductive pad, the upper surface faces towards the bottom surface and faces away from the top surface, and the insulative housing contacts the lower surface; and
      a conductive trace that includes a terminal and a lead, wherein the terminal extends through the central portion, the lead protrudes laterally from and extends through the side surface, the terminal and the lead are spaced and separated from one another outside the insulative housing, and the terminal and the lead are electrically connected to one another and the pad inside the insulative housing and outside the first chip;
   a second device that includes a second semiconductor chip, wherein the second device includes a major surface inside the cavity, and the second device is positioned within and does not extend outside a periphery of the cavity; and
   a conductive bond inside the cavity and on the terminal that contacts and electrically connects the first and second devices.

32. The multichip device of claim 31, wherein the insulative housing consists of first and second single-piece housing portions, the first single-piece housing portion provides the top surface, the side surfaces and the peripheral ledge, contacts the lower surface and the lead and is spaced from the terminal, and the second single-piece housing portion provides the central portion and contacts the first single-piece housing portion and the terminal.

33. The multichip device of claim 31, wherein the terminal is within a periphery of the first chip and a periphery of the second chip.

34. The multichip device of claim 31, wherein the conductive bond is within a periphery of the first chip and a periphery of the second chip.

35. The multichip device of claim 31, wherein the first chip is within and does not extend outside the periphery of the cavity.

36. The multichip device of claim 31, wherein the first device is a single-chip package.

37. The multichip device of claim 31, wherein the second device is the second chip.

38. The multichip device of claim 31, wherein the second device is a chip scale package.

39. The multichip device of claim 31, wherein the first device is a TSOP package, and the second device is a chip scale package.

40. The multichip device of claim 31, wherein the multichip device is devoid of wire bonds and TAB leads.

\* \* \* \* \*